United States Patent
Yamazaki et al.

(10) Patent No.: US 7,378,291 B2
(45) Date of Patent: May 27, 2008

(54) METHOD OF MANUFACTURING A LIGHT EMITTING DEVICE

(75) Inventors: Shunpei Yamazaki, Tokyo (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 89 days.

(21) Appl. No.: 10/188,232

(22) Filed: Jul. 3, 2002

(65) Prior Publication Data

US 2003/0008429 A1 Jan. 9, 2003

(30) Foreign Application Priority Data

Jul. 6, 2001 (JP) .............. 2001-206751

(51) Int. Cl.
*H01L 21/20* (2006.01)

(52) U.S. Cl. ................. 438/30; 257/33.001

(58) Field of Classification Search ........... 438/21–31, 438/99
See application file for complete search history.

(56) References Cited

U.S. PATENT DOCUMENTS

| | | | |
|---|---|---|---|
| 5,684,365 A | 11/1997 | Tang et al. | |
| 6,013,982 A * | 1/2000 | Thompson et al. | 313/506 |
| 6,057,647 A | 5/2000 | Kurosawa et al. | |
| 6,283,578 B1 | 9/2001 | Popall et al. | |
| 6,342,275 B1 * | 1/2002 | Miyakawa et al. | 427/488 |
| 6,399,226 B1 * | 6/2002 | Kitaguchi et al. | 428/690 |
| 6,420,200 B1 | 7/2002 | Yamazaki et al. | |
| 6,440,877 B1 | 8/2002 | Yamazaki et al. | |
| 6,533,376 B1 * | 3/2003 | Gailus et al. | 347/1 |
| 6,575,800 B1 * | 6/2003 | Kobayashi et al. | 445/24 |
| 6,821,553 B2 | 11/2004 | Miyashita et al. | |
| 6,830,494 B1 | 12/2004 | Yamazaki et al. | |
| 6,833,156 B2 | 12/2004 | Miyashita et al. | |
| 6,843,937 B1 | 1/2005 | Kiguchi et al. | |
| 6,872,672 B2 * | 3/2005 | Yamazaki et al. | 438/780 |
| 7,063,869 B2 | 6/2006 | Yamazaki et al. | |
| 2002/0163562 A1 * | 11/2002 | Tanaka et al. | 347/65 |
| 2002/0180372 A1 * | 12/2002 | Yamazaki | 315/169.3 |

(Continued)

FOREIGN PATENT DOCUMENTS

CN 1212114 3/1999

(Continued)

OTHER PUBLICATIONS

U.S. Appl. No. 09/580,485, filed May 30, 2000 is being submitted as related information.

(Continued)

*Primary Examiner*—Savitri Mulpuri
(74) *Attorney, Agent, or Firm*—Nixon Peabody LLP; Jeffrey L. Costellia

(57) ABSTRACT

A technique capable of efficient, high speed processing for the formation of an organic compound layer by using an ink jet method is provided. In the method of forming an organic compound layer by using the ink jet method, a composition containing an organic compound having light emitting characteristics is discharged from an ink head, forming a continuous organic compound layer. The organic compound layer is formed on pixel electrodes aligned in a matrix shape, and is formed in a continuous manner over a plurality of pixel electrodes. A light emitting device is manufactured using organic light emitting elements in accordance with this manufacturing method.

26 Claims, 19 Drawing Sheets

U.S. PATENT DOCUMENTS

| | | |
|---|---|---|
| 2003/0010283 A1 | 1/2003 | Yamazaki et al. |
| 2003/0016277 A1* | 1/2003 | Hawkins et al. ............... 347/77 |
| 2003/0030766 A1* | 2/2003 | Kiguchi et al. ............. 349/106 |

FOREIGN PATENT DOCUMENTS

| | | |
|---|---|---|
| EP | 0 880 303 A1 | 11/1998 |
| EP | 1 211 916 A1 | 6/2002 |
| EP | 1 376 716 A2 | 1/2004 |
| JP | 08-234683 A | 9/1996 |
| JP | 10-012377 A | 1/1998 |
| JP | 10-153967 A | 6/1998 |
| JP | 10-189252 A | 7/1998 |
| JP | 11-054270 A | 2/1999 |
| JP | 11-074083 | 3/1999 |
| JP | 2001-085161 | 3/2001 |
| JP | 2003-007459 | 1/2003 |
| TW | 340978 | 9/1998 |
| TW | 406519 | 9/2000 |
| WO | WO 2006/073072 A1 | 7/2006 |

OTHER PUBLICATIONS

U.S. Appl. No. 09/680,492, filed Oct. 6, 2000 is being submitted as related information.

T. Shimoda et al., "Multicolor Pixel Patterning of Light-Emitting Polymers by In-jet Printing", SID 99 DIGEST, pp. 376-379.

Hsu, Che-H. et al., "5.4: A High Work Function Hole-Injection Material for Enhanced OLED Performance", SID Digest '07: SID International Symposium Digest of Technical Papers, pp. 49-51.

Feehery, W. F., "69.1: Invited Paper: Solution Processing of Small-Molecule OLEDs", SID Digest '06: SID International Symposium Digest of Technical Papers, pp. 1834-1836.

Hsu, Che-H. et al., "5.4: A High Work Function Hole-Injection Material for Enhanced OLED Performance", SID Digest '06: SID International Symposium Digest of Technical Papers, vol. 38, pp. 49-51.

Feehery, W.F., "69.1: Invited Paper: Solution Processing of Small-Molecule OLEDs", SID Digest '07: SID International Symposium Digest of Technical Papers, vol. 37, pp. 1834-1836.

* cited by examiner

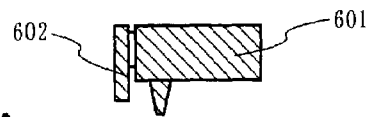

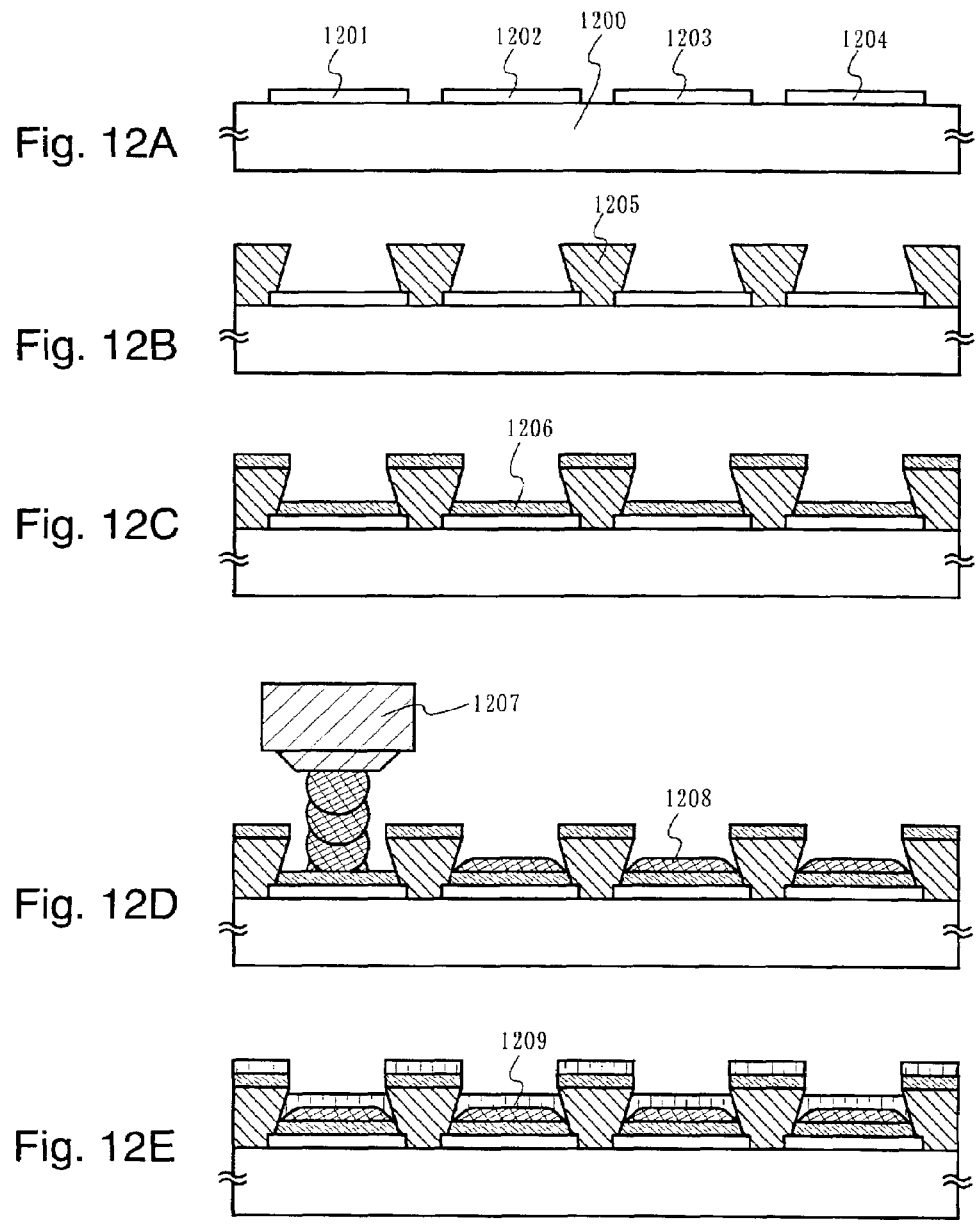

METHOD OF MANUFACTURING A LIGHT EMITTING DEVICE

BACKGROUND OF THE INVENTION

1. Field of the Invention

The present invention relates to a method of manufacturing a light emitting device that uses an organic compound as a light emitter, in particular, a method of manufacturing a light emitting device by using an ink jet method.

2. Description of the Related Art

Organic light emitting elements are formed so as to have a structure in which a thin film containing an organic compound in which fluorescence or phosphorescence can be obtained, is sandwiched between a pair of electrodes composed of an anode and a cathode. This light emitting mechanism is regarded as a phenomenon in which electrons injected from the cathode and holes injected from the anode recombine in a light emitting layer containing a light emitting substance, forming molecular excitons, and light is emitted when the molecular excitons return to a base state. Light emission from a singlet excitation state (fluorescence) and light emission from a triplet excitation state (phosphorescence) exist as light emitting processes. Light emission having a brightness of several thousands to several tens of thousands of $cd/m^2$ is possible, from blue color light to red color light, by appropriately selecting organic compound materials and dopants, even with an applied voltage equal to or less than 10 V. In principle, therefore, it can be considered that it is sufficiently possible to apply this type of light emission to display devices and the like.

Consideration of both high molecular weight compounds and low molecular weight compounds for use as organic compounds is advancing, and development is progressing. However, whichever is used, they are difficult to be applied to patterning processes such as photolithography because they have low resistance to heat. Ink jet methods are being developed in order to overcome that problem, and photolithography patterning processes are unnecessary because a pattern is drawn directly on a substrate.

Regarding the ink jet methods, a technique of manufacturing an active matrix organic EL display is disclosed in JP-A-10-012377. Pixel electrodes are formed on a glass substrate having thin film transistors, and red, green, and blue color light emitting layers are formed on the pixel electrodes for each pixel by the ink jet method.

As the organic compound materials used for ink jet process, precursors of cyanopolyphenylenevinylene, polyphenylenevinylene, and the like; derivative of aromatic diamine, oxydiazole, distylarylene, triphenylamine, distyryl, and the like; and complexes such as quinolinol metal, azomethine zinc, porphyrin zinc, benzoxazole zinc and phenanethroline europium are known.

The aforementioned organic compounds, in a state in which they are dissolved or dispersed in a solvent (hereafter referred to as a "composition") are dripped from an ink head of an ink jet printing apparatus, forming a film on a substrate. Physical properties of the composition such as viscosity, surface tension, and drying speed become vital parameters. Furthermore, the geometric structure of the ink head and the drive conditions are very important for dripping the composition onto the substrate with good reproducibility, and the weight of the composition discharged, its direction, period, and the like are parameters.

A piezoelectric element is used in discharging the composition from the ink head in the ink jet method. The volume of a container filled with the composition is changed by utilizing vibrations of the piezoelectric element, discharging the composition to the outside.

The amount of the composition discharged from the ink head one time is from 10 to 40 pl, and it can be considered that a viscosity of 1 to 20 cp is good. If the viscosity is low, then a desired film thickness cannot be obtained. Thus, problems develop, such as the composition flowing out on the surface of the substrate after impact, causing a pattern to become wider than necessary. Further, if the viscosity is too high, then problems such as the composition not being able to be discharged out smoothly from a discharge port of the ink head, one drop of the discharged compound being pulled into the shape of a thread, causing defective pattern shapes after impact.

Solvents that vaporize after being dripped onto the substrate are suitable as solvents for the composition. However, if dripping is not normally performed continuously, then the solvent will volatilize and the composition will harden near the discharge port. For example, if a very volatile solvent such as toluene is used, then it is necessary to be particularly careful. Even if discharging is performed continuously, solids gradually grow in the vicinity of the discharge port, and in the worst cases, close off the nozzle. Even if the solids in the vicinity of the discharge port to not reach such a level, they will change the direction that the composition is discharged at, causing a remarkable drop in the impact precision. In addition, a defect develops in which the amount of the composition discharged from the nozzle is reduced because the diameter of the nozzle becomes smaller, thus reducing the thickness of an organic compound layer formed on the substrate. In order to prevent these problems, it is necessary to perform frequent cleaning of the ink head in order to prevent clogging by solids with a conventional ink jet method.

SUMMARY OF THE INVENTION

In view of the above-mentioned problems, the present invention has been made, and therefore an object of the present invention is to provide a technique in which efficient, high speed processing is possible for the formation of an organic compound layer by an ink jet method.

In order to resolve these problems, a composition containing an organic compound that has light emitting characteristics is discharged from an ink head, forming a continuous organic compound layer, in a method of forming an organic compound layer by ink jet with the present invention. The organic compound layer is formed on pixel electrodes aligned in a matrix shape, and the organic compound layer is formed to be continuous over a plurality of the pixel electrodes. A light emitting device using organic light emitting elements is then manufactured by this manufacturing method.

The present invention can be applied to a method of manufacturing a light emitting device in which organic light emitting elements are aligned in a matrix shape, forming a pixel portion. In employing an active matrix drive method, pixel electrodes are formed on a substrate having thin film transistors, a hole injecting layer is formed on an upper layer of the pixel electrode, and a composition containing an organic compound having light emitting characteristics is discharged from an ink head on the hole injecting layer, forming a continuous organic compound layer.

The composition discharged onto the surface of the substrate hardens by the vaporization of a solvent, forming the organic compound layer. However, if the composition adheres in water droplet shapes due to surface tension, then an organic compound layer having a uniform thickness cannot be obtained. Therefore, the organic compound layer is made smoother by a smoothing means. A gas is expelled from a discharge port, making the composition smoother, as to the smoothing means. Alternatively, smoothing may also be performed by leveling the surface of the continuously formed composition by using a spatula or the like.

If an inert gas such as nitrogen or argon is used as the gas that is expelled, then the composition solvent can be volatilized, and oxidation can be prevented. Alternatively, an opening having a concentric circular shape can be formed in the outer circumference of the discharge port. By expelling a gas from the opening, smoothing can be performed, and at the same time the composition can be prevented from drying and hardening in the discharge port, causing clogging.

With the present invention, a solution in which an organic light emitting material or a precursor thereof is dissolved or dispersed in a solvent, is used at the composition having light emitting characteristics when forming a pattern by an ink jet method. For example, organic compounds which do not have sublimability, and have molecularity equal to or less than 20 or have a molecular chain length equal to or less than 10 μm, (referred to as intermediate molecular weight compounds in this specification) can be used.

In addition, compositions containing high molecular weight compounds such as polyparaphenylene vinylenes, polyparaphenylenes, polythiophenes, and polyfluorenes can be applied as examples of compositions having light emitting characteristics used when forming a pattern by an ink jet method. At least one type of fluorescent pigment for changing the light emitting characteristics may be added to the light emitting composition in order to change the color of light emitted by organic light emitting elements manufactured using the composition.

With a conventional ink jet method, a predetermined pattern is formed by repeatedly performing position control of an ink head and an operation to discharge a composition. However, the amount of time needed for position alignment can be reduced, formation of the organic compound layer can be made easier, and the amount of processing time can be reduced by forming the organic compound layer in a linear shape or a stripe shape by continuously discharging the composition onto the substrate for each dot.

In particular, the present invention is applied to methods of production in which a plurality of display panels are cut out from one large surface area substrate. Further, an ink head can be moved at high speed with respect to a large surface area substrate by momentarily stopping the discharging of a mixture while moving between pixel regions for cases in which a plurality of pixel regions are formed in the large surface area substrate.

BRIEF DESCRIPTION OF THE DRAWINGS

In the accompanying drawings:

FIGS. 12A to 12E are cross sectional views for explaining a process of manufacturing an organic light emitting device using an ink jet method;

DETAILED DESCRIPTION OF THE PREFERRED EMBODIMENTS

Embodiment Mode

Figure 1:
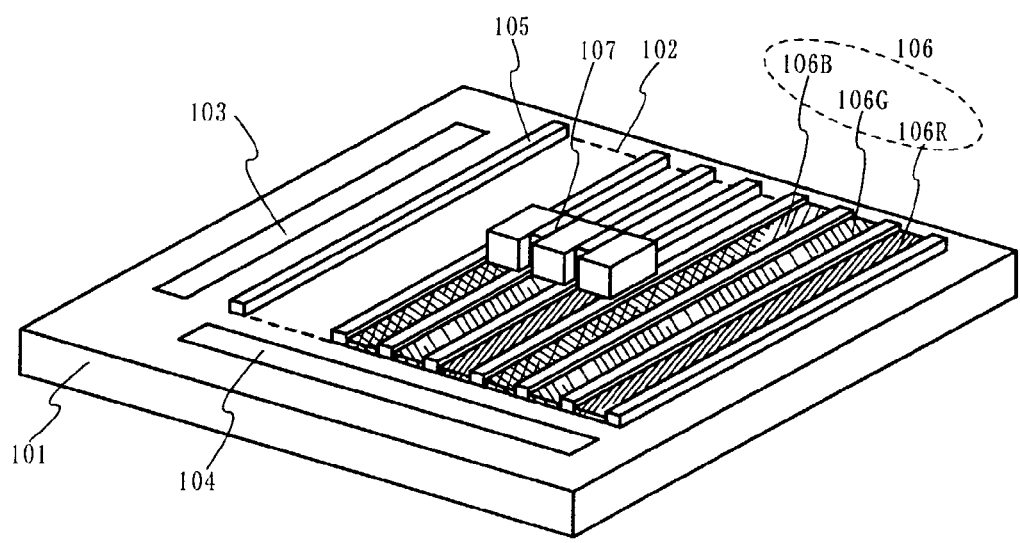
FIG. 1 is a view for explaining the concept of forming an organic compound layer continuously by an ink jet method of the present invention.

An embodiment mode of the present invention is explained with reference to FIGS. 1 through 11C. FIG. 1 shows a stage at which a data line driver circuit 104 is formed on a substrate 101, and organic compound layers are formed on a pixel portion 102 by an ink jet method. Stripe shape partitions 105 are formed in the pixel portion 102, and the organic compound layer is formed between the partitions. The partitions 105 are formed in order to prevent adjacent organic compound layers from mixing with each other when forming the organic compound layers by the ink jet method.

Organic compound layers 106 are formed by discharging a composition containing an organic compound material that has light emitting characteristics from an ink head 107. The composition is discharged continuously from the ink head, forming a linear shape pattern. There are no particular limitations placed on the organic compound layer material, but in order to perform color display organic compound layers 106R, 106G, and 106B which emit light in the colors red, green, and blue, respectively, are formed.

A single layer structure may be used when forming the organic compound layer using a high molecular weight material suitable for the ink jet method. A laminate structure having two or more layers may also be formed preferably in order to further increase the efficiency of light emission. A typical laminate structure has a hole transporting layer and a light emitting layer laminated together.

As the polymeric organic compounds for forming the layer of the organic compound, the materials soluble in the organic solvent such as polyparaphenylenevinylene derivatives, polythiophene derivatives, polyfluorerene derivatives, polyparaphenylene derivatives, polyalkylphenylene, and polyacetylene derivatives can be used.

As the polyparaphenylenevinylene derivatives, poly(2,5-dialkoxy-1,4-phenylenevinylene): RO-PPV can be used. Specifically, the materials such as poly(2-methoxy-5-(2-ethyl-hexoxy)-1,4-phenylenevinylene): MEH-PPV and poly(2,5-dimethyloctylsilyl-1,4-phenylenevinylene): DMOS-PPV can be used.

As polyparaphenylene derivatives, poly(2,5-dialkoxy-1, 4-phenylene): RO-PPP can be used.

As the polythiophene derivatives, poly(3-alkylthiophene): PAT can be used. Specifically, the materials such as poly(3-hexylthiophene): PHT, poly(3-cyclohexylthiophene): PCHT can be used. Poly(3-cyclohexyl-4-methylthiophene): PCHMT, poly(3-[4-octylphenyl]-2,2'-bithiophene): PTOPT, poly(3-(4-octylphenyl)-thiophene): POPT-1, or the like can be also used in addition to the above-mentioned materials.

As the polyfluorene derivatives, poly(dialkylfluorene): PDAF can be used. Specifically, the materials such as poly(dioctylfluorene): PDOF can be used.

As the polyacetylene derivatives, the materials such as polypropylphenylacetylene: PPA-iPr, polybutylphenylphenylacetylene: PDPA-nBU, polyhexylphenylacetylene: PHPA can be used.

Moreover, toluene, benzene, chlorobenzene, dichlorobenzen, chloroform, tetrallin, xylene, anisole, dichrolomethane, γ-butyrlactone, butyl cellosolve, cyclohexane, NMP (N-methyl-2-pyrrolidone), dimethyl sulfoxide, cyclohexanone, dioxane, THF (tetrahydrofuran), or the like can be used as the solvents for those polymeric organic compounds.

Further, PEDOT (poly(3,4-ethylene dioxythiophene)) and polyaniline (PA) can also be used as a high molecular weight compound with hole injecting characteristics. Note that these materials are water soluble. It is possible to form PEDOT by an application method. A second organic compound layer can also be formed by an ink jet method on a first organic compound layer (PEDOT) formed by an application method.

In addition, organic compounds which do not have sublimability, and have molecularity equal to or less than 10 or have a molecular chain length equal to or less than 5 μm, (these compounds are called intermediate molecular weight organic compounds) can also be used. Tetrakis(2-mercapto-benzo-oxazolato) tungsten and the like can be given as examples of such materials. Problems exist with pattern formation by an ink jet method using high molecular weight organic compound materials, such as the falling mixture being pulled into a thread and becoming linear shaped. However, this type of problem does not develop with intermediate molecular weight organic compounds having a small number of linked molecules. Furthermore, if a mixture of high molecular weight organic compound materials is formed, then it is necessary to consider the combination of a solvent for dissolving the high molecular weight mixture and the materials structuring the ink head. In practice, it is necessary to use a solvent that does not cause the ink head materials to corrode. However, this type of problem does not develop with intermediate molecular weight organic compounds because it is also possible to use them as dispersed in an aqueous solution.

Moreover, toluene, benzene, chlorobenzene, dichlorobenzene, chloroform, tetralin, xylene, dichloromethane, cyclohexane, NMP (N-methyl-2-pyrrolidone), dimethyl sulfoxide, cyclohexanone, dioxane, THF (tetrahydrofuran), or the like can be applied as the solvent.

Figure 2:
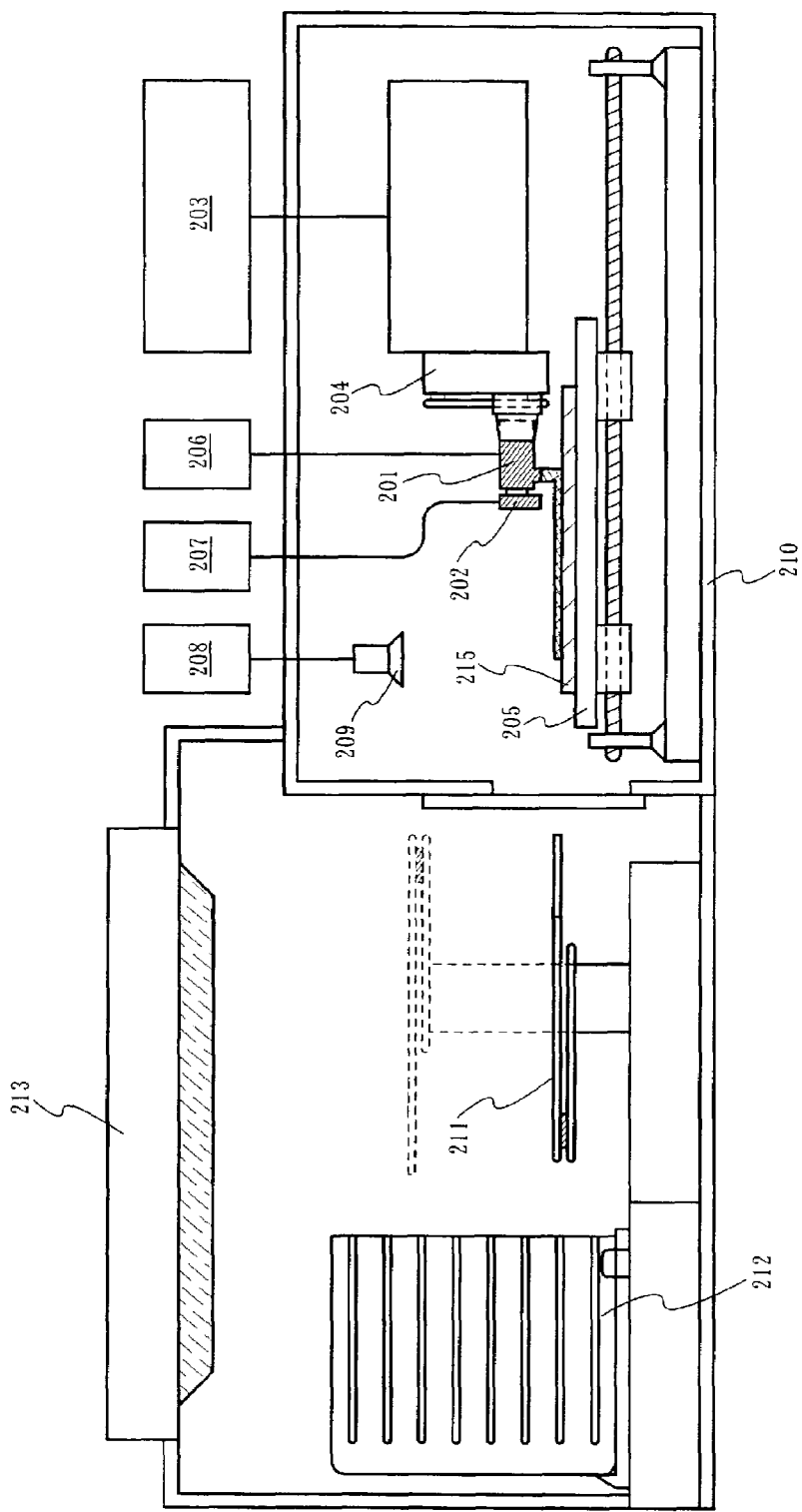
FIG. 2 is a view for explaining the structure of a printing apparatus of an ink jet method.

FIG. 2 shows the structure of a printing apparatus that uses an ink jet method. The discharge period for a composition discharged from an ink head 201 is regulated, along with the movement speed of a substrate, so as to continuously form an organic compound pattern on the substrate. A nozzle 202 for expelling a gas is provided adjacent to the ink head 201 as a means of smoothing the composition (or organic compound). The nozzle is used in order to smooth the composition that is discharged onto a substrate 215 by the gas expelled from the nozzle. Further, a gap between the ink head 201 and the substrate 215 is maintained at a distance equal to or less than 1 mm in order to increase the accuracy of the impact position of the discharged composition. This is structured by forming a movement mechanism 204 for moving the ink head 201 upwards and downwards, and a control means 203, and the substrate 215 is brought near to the ink head only during pattern formation.

As for other structures, components such as a substrate stage 205 for fixing the substrate, for moving the substrate in the x, y, and θ directions, and for fixing the substrate by a technique such as a vacuum chuck, a means 206 for supplying the composition to the ink head 201, and a means 207 for supplying the gas to the nozzle 202 are used. A casing 210 covers parts such as the ink head 201 and the substrate stage 205. If the atmosphere is replaced by supplying the same gas as the composition solvent using a shower head 209 formed in a gas supply means 208 and within the casing 210, then drying can prevented to a certain degree, and printing can be continued for a long time. Other accompanying constituents may be included such as a cassette 212 for holding substrates to be processed, a conveyor means 211 for removing the substrates from, and placing the substrates into, the cassette 212, and a clean unit 213 for reducing dust in the work region by sending out clean air.

Figure 3:
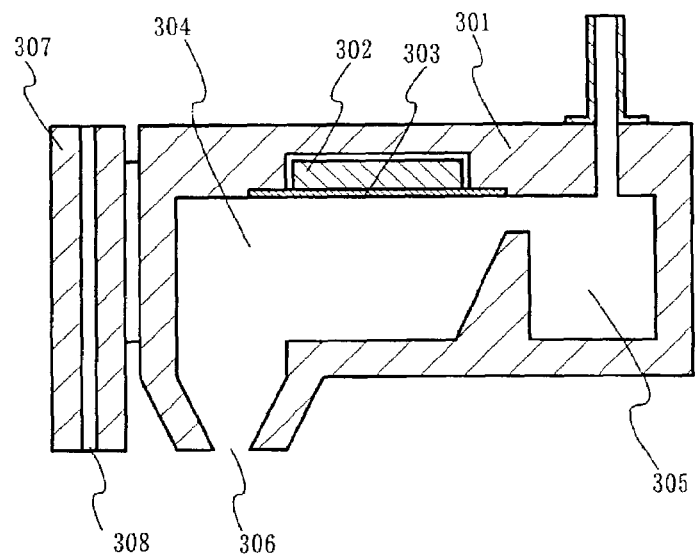
FIG. 3 is a cross sectional view for explaining an example of an ink head structure.

The ink head for discharging the composition in order to form the organic compound layer shoulders a very important role in determining the pattern precision. FIG. 3 shows an example of an ink head structure. That is, a casing 301 has a pressure generation chamber 304 whose one surface is sealed by an elastic plate 303, on which a piezoelectric element 302 is mounted, and a reservoir 305 for temporarily storing the supplied composition. An opening is formed in one edge of the pressure generation chamber 304, and a discharge port 306 for discharging the composition is formed. The elastic plate 303 structuring the pressure generation chamber 304 changes the volume of the pressure generation chamber 304 due to deflections of the piezoelectric element 302, causing the mixture to be discharged. A nozzle 307 in which an opening 308 is formed and which is used as the smoothing means expels the gas toward the substrate surface, is formed in the vicinity of the discharge port 306 of the ink head.

Figure 4:
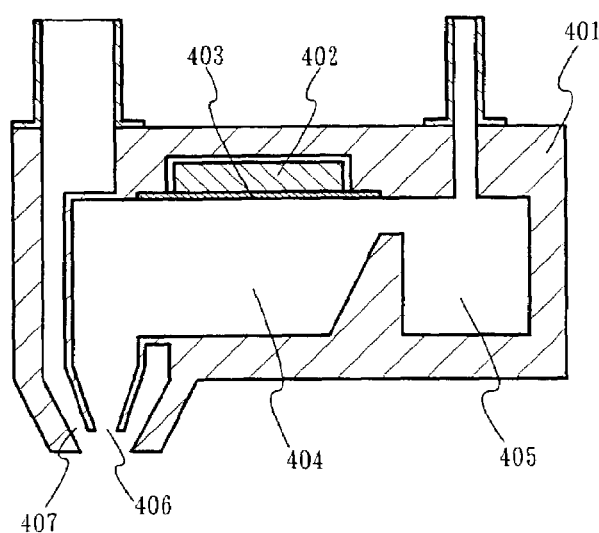
FIG. 4 is a cross sectional view for explaining an example of an ink head structure.

Another example of an ink head is shown in FIG. 4. The ink head structure has a piezoelectric element 402 and an elastic plate 403 formed in a casing 401, similarly allowing for a mixture to be continuously discharged. An opening 408 is formed having a concentric circular shape in the outer perimeter of a discharge port 406 formed in a pressure generation chamber 404. Smoothing can be performed by expelling the gas from the opening 408. Further, applying the gas having similar properties as the composition solvent, the composition is prevented from drying and hardening at the discharge port 406.

Figure 5:
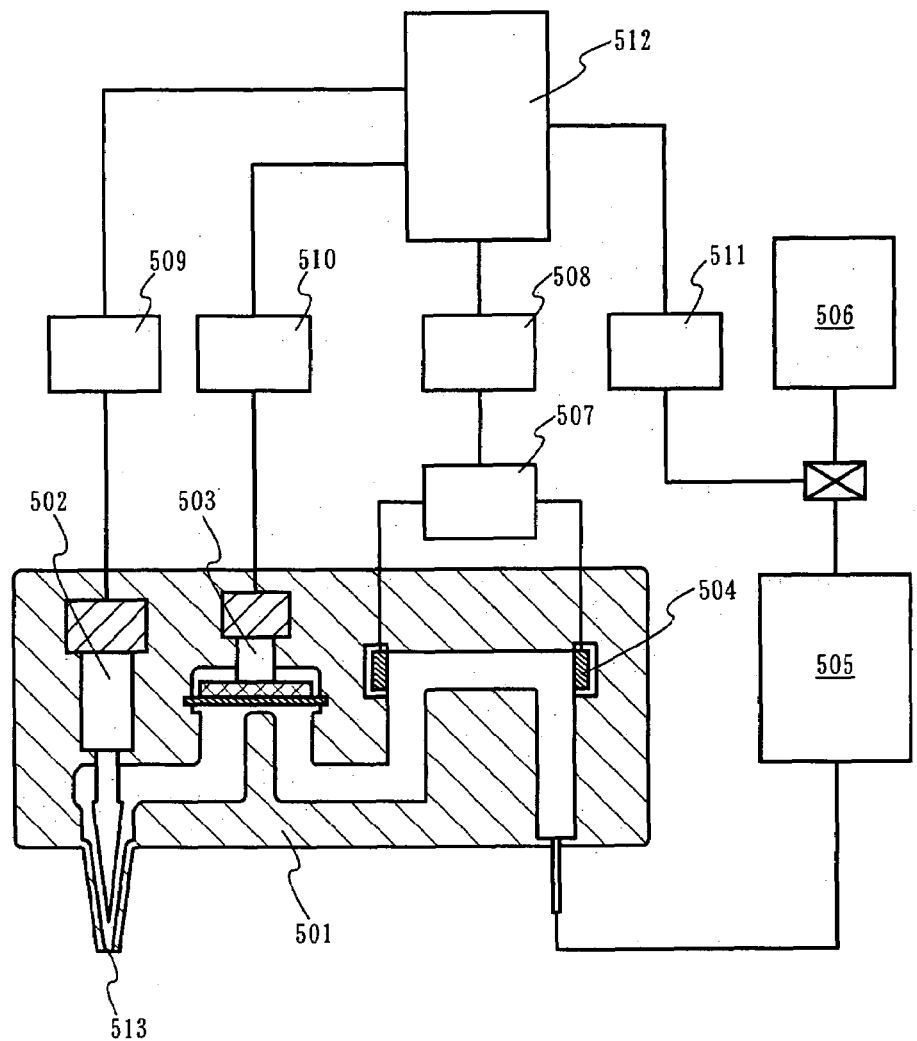
FIG. 5 is a cross sectional view for explaining an example of an ink head structure.

FIG. 5 shows the structure of an ink head which pushes out the composition using compressed gas, continuously supplying the composition to a film formation surface. A pathway for the composition to flow along is formed in a casing 501, a diaphragm valve 503 is formed partway along the pathway, and a needle valve 502 is formed in a discharge port 513. Both are for controlling the supply of the composition, but the needle valve 502 is formed for supplying the composition and for instantaneously performing interruption of the supply. The composition is supplied from the reservoir 505 by utilizing a compressed gas supply means 506. The supply amount is detected by a detector (composed of an ultrasonic head 504 and a detection circuit 507) which utilizes ultrasonic waves, and the obtained information is input to a processing unit 512 through an A/D converter 508. The processing unit 512 sends signals to, and receives signals from, an external information processing apparatus through an interface, and performs control of each valve of various types through A/D or D/A converters 509 to 511. A linear shape pattern can also be formed in accordance with this structure.

One discharge port may be formed in the ink head, and a plurality of discharge ports may also be formed for performing very efficient printing. For example, the discharge ports may be formed on a one to one basis corresponding to one group of pressure generation chambers, and one group of pressure generation chambers may correspond to a plurality of discharge ports.

Figure 6A:
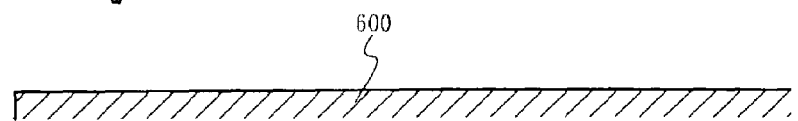
FIGS. 6A to 6E are views for explaining a process of forming a continuous organic compound layer.
Figure 6B:
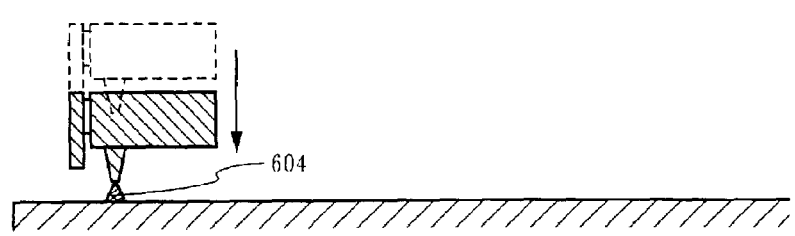

FIGS. 6A to 6E show step by step a method of forming a linear shape organic compound layer in which an ink head 601 sprays a composition onto a film formation surface 600 on a substrate. FIG. 6A shows the initial state. The ink head 601 and a nozzle 602 approach the film formation surface 600 as shown in FIG. 6B when forming a pattern on the film formation surface 600, and discharging of a composition 604 then begins.

Figure 6C:
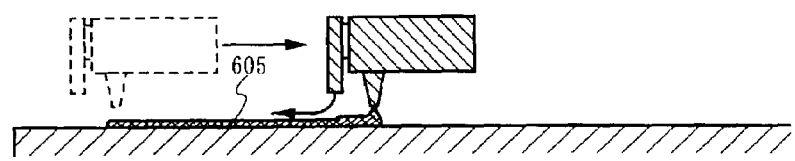
Figure 6D:
Figure 6E:
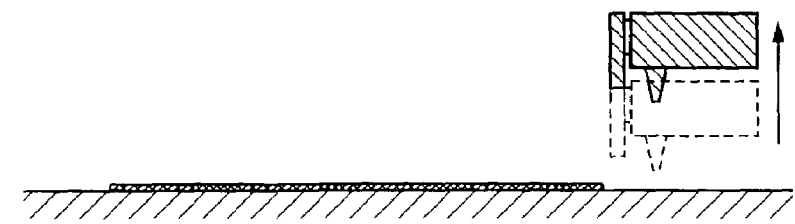

A linear shape pattern 605 is then formed by moving the ink head 601 and the film formation surface 600 relative to each other as shown in FIG. 6C. The pattern can be made smoother by a gas expelled from a smoothing means 602. The ink head 601 stops discharging the composition after arriving at a predetermined position (FIG. 6D), and then moves away from the film formation surface 600 (FIG. 6E). A continuous organic compound layer pattern having a predetermined thickness can thus be formed on the film formation surface 600.

Figure 7A:
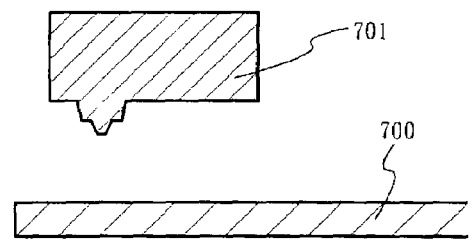
FIGS. 7A to 7D are views for explaining a process of forming a continuous organic compound layer.
Figure 7B:
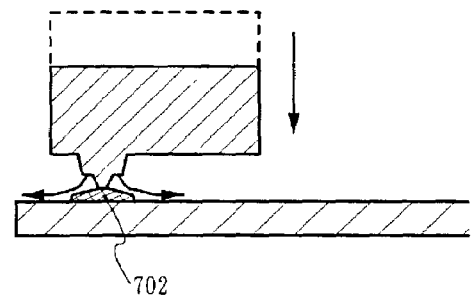

Further, FIGS. 7A to 7D show step by step another method of forming a linear shape organic compound layer in which an ink head 701 sprays a composition onto a film formation surface 700 on a substrate. FIG. 7A shows the initial state, and the ink head 701 approaches the film formation surface 700 as shown in FIG. 7B when forming a pattern on the film formation surface 700. Discharging of a composition 702 then begins.

Figure 7C:
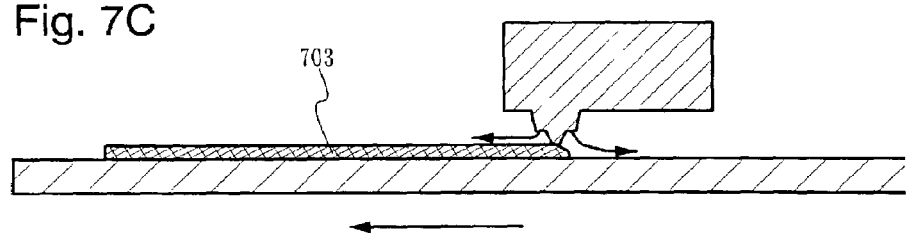
Figure 7D:
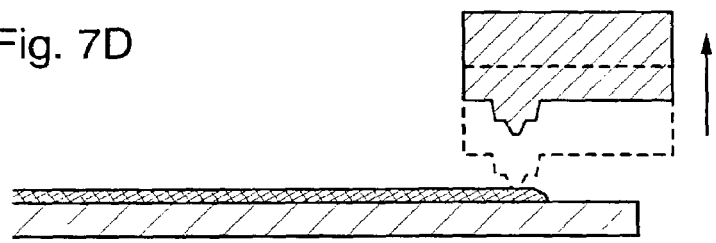

A linear shape pattern 703 is then formed by moving the ink head 701 and the film formation surface 700 relative to each other as shown in FIG. 7C. The formed organic compound pattern is controlled by the amount of composition discharged, and in addition, by the gap between the ink head 701 and the film formation surface 700. The ink head 701 stops discharging the composition after arriving at a predetermined position, and then moves away from the film formation surface 700 (FIG. 7D). A continuous organic compound layer pattern can thus be formed on the film formation surface 700.

Figure 8:
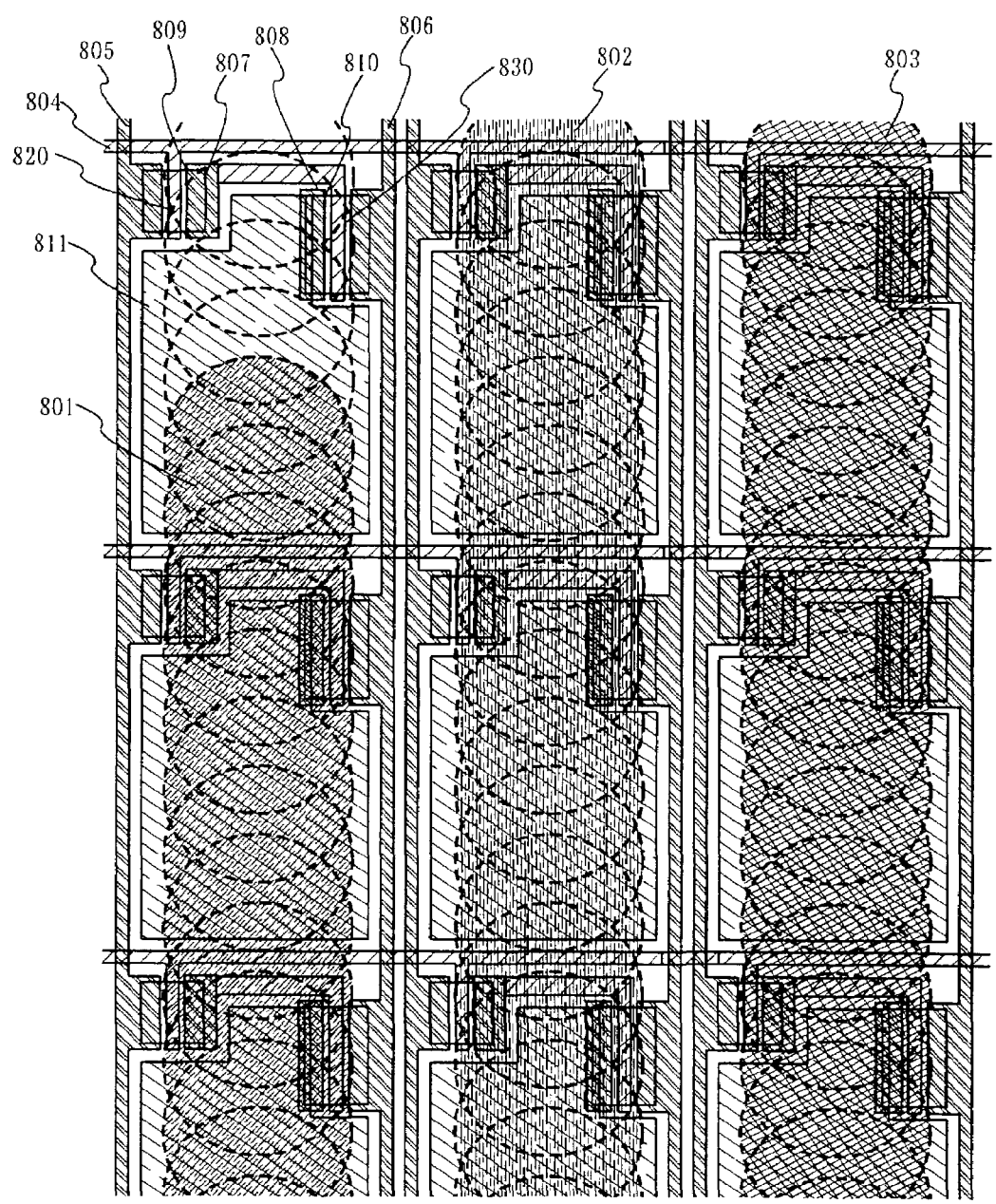
FIG. 8 is a view for explaining the concept of continuously forming an organic compound layer with respect to each of the pixel electrodes aligned in a matrix shape.

FIG. 8 shows an example of a pixel portion in which organic compound layers 801 to 803 are formed. The pixel portion has a gate line 804, a data line 805, an electric power source supply line 806, a pixel electrode 811, and semiconductor layers 809 and 810. Thin film transistors 820 and 830 are thus structured. The pixel electrode 811 is connected to the thin film transistor 830, being arranged in matrix to for a pixel portion as a whole. The organic compound layers are formed using the ink head explained by FIG. 3 or FIG. 4, and a composition is continuously discharged one drop at a time onto the pixel electrodes, forming overall linear shape organic compound layers.

Figure 9:
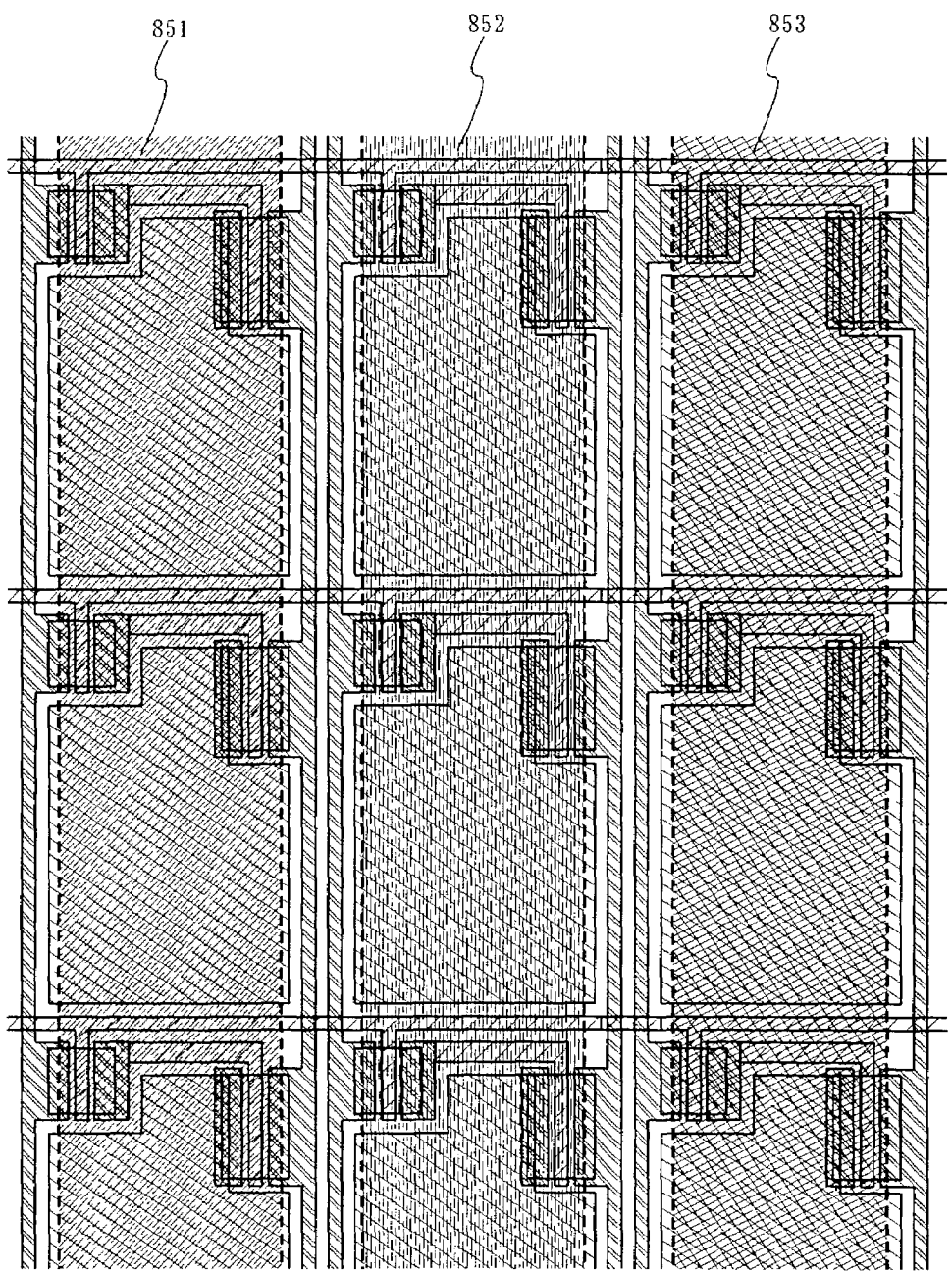
FIG. 9 is a view for explaining the concept of continuously forming an organic compound layer with respect to each of the pixel electrodes aligned in a matrix shape.

FIG. 9 shows an example of forming organic compound layers 851 to 853 using the ink head of FIG. 5 with respect to a pixel portion having a similar structure to the aforementioned pixel portion. The composition is supplied continuously in this case, and therefore the organic compound layer formed on an upper layer of the pixel electrode is also formed having a linear shape or a stripe shape. Note that, for color display, organic compound layers for emitting colored light corresponding to red, green, blue and the like may be formed for these organic compound layers.

Figure 10:
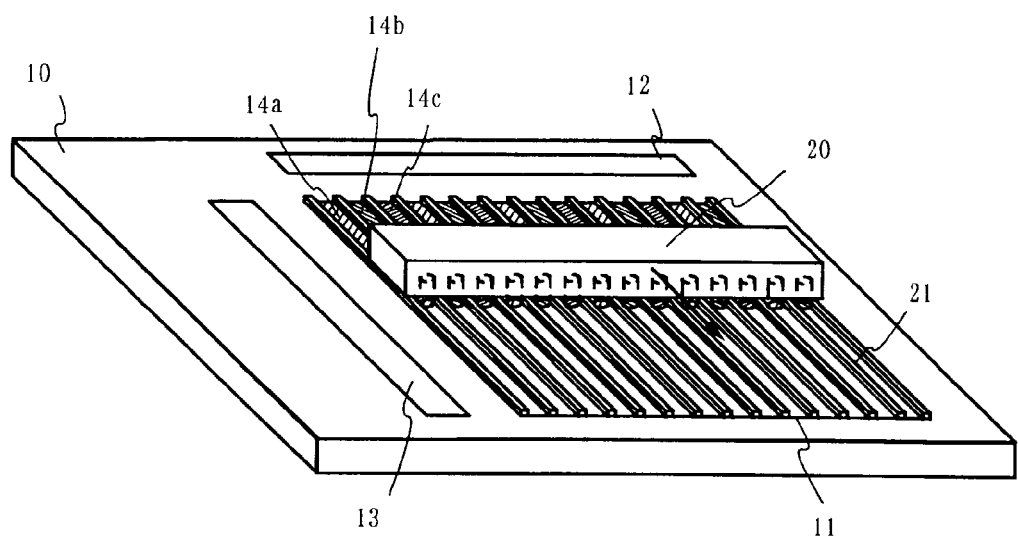
FIG. 10 is a view for explaining the concept of continuously forming an organic compound layer by an ink jet method of the present invention.

FIG. 10 shows an example of applying an organic compound all at once to all pixel rows formed in a pixel portion. The number of discharge ports attached to a head portion 20 is the same as the number of pixel rows. By using this type of structure, it becomes possible to form organic compound layers in each of the pixel rows in one scan, and throughput thus increases by a large amount.

Further, the pixel portion may also be divided into a plurality of zones, and a head portion having the same number of discharge ports as the number of pixel rows contained within the zones may be used. In other words, if the pixel portion is divided into n zones, then organic compound layers can be formed in all of the pixel rows by scanning n times.

Figure 11A:
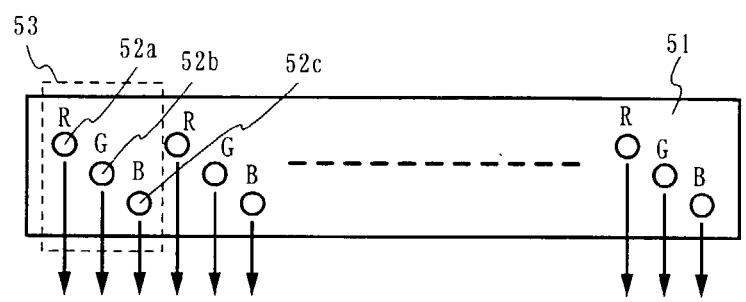
FIGS. 11A to 11C are views showing the arrangement of discharge openings on a head portion.
Figure 11B:
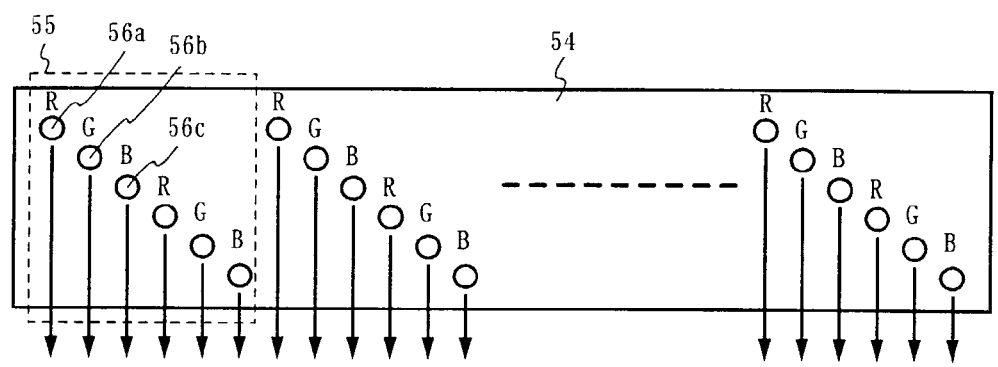
Figure 11C:
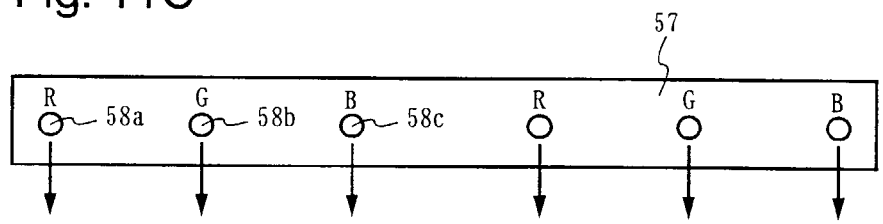

In practice, there are cases in which the pixel size is small at several tens of μm, and therefore the width of the pixel rows is also on the order of several tens of μm. In this case it is difficult to line up the discharge ports in a single horizontal row, and therefore it is necessary to devise a different discharge port arrangement. Shown in FIGS. 11A to 11C are examples of changing the positions at which discharge ports are attached to an ink head. FIG. 11A is an example in which discharge ports 52a to 52c are formed at positions shifted diagonally with respect to an ink head 51. Note that the reference numeral 52a denotes a discharge port for applying a red color light emitting composition, the reference numeral 52b denotes a discharge port for applying a green color light emitting composition, the reference numeral 52c denotes a discharge port for applying a blue color light emitting composition. Further, each of the arrows corresponds to one pixel row. The organic compound layers can be formed without any interference between adjacent discharge ports by using this type of discharge port alignment, even if the pitch between the pixel rows is small.

Taking the discharge ports 52a to 52c as one unit, as denoted by reference numeral 53, from one to a plurality of units are formed in the head portion. If there is one of the single units 53, then the composition is applied simultaneously to three rows of pixels. If there are n of the single units 53, then the composition is applied simultaneously to 3n rows of pixels. The level of freedom in the placement spacing of the discharge ports can thus be increased, and the present invention can easily be implemented in a high definition pixel portion. Furthermore, all of the pixel rows in the pixel portion can be processed in one batch by using the ink head 51 of FIG. 11A, and it is also possible to divide the pixel portion into a plurality of zones and then perform processing several times.

Next, an ink head 54 shown in FIG. 11B is a variation of FIG. 11A, being an example of a case in which the number of nozzles contained in one single unit 55 is increased. Two each of the following discharge ports are contained within the unit 55: a discharge port 56a for applying a red color light emitting layer composition, a discharge port 56b for applying a green color light emitting layer composition, and a discharge port 56c for applying a blue color light emitting layer composition. An organic compound can be applied simultaneously to a total of six pixel rows by using one unit 55.

From one to a plurality of the units 55 are formed in the embodiment mode. A composition can be applied simultaneously to six rows of pixels if one unit 55 is formed, and the composition can be applied to 6n rows of pixels simultaneously if n of the units 55 are formed. It is of course not necessary to limit the number of nozzles formed within the unit 55 to 6, and an additional plurality thereof can also be formed. All of the pixel rows in the pixel portion can be processed in one batch also with this type of structure, similar to that of FIG. 11A, and it is possible to divide the pixel portion into a plurality of zones and perform processing several times.

An ink head 57 shown in FIG. 11C can also be used. In the ink head 57, three are formed, with three pixel row portions of space left open between them, a discharge port 58a for applying a red color light emitting application liquid, a discharge port 58b for applying a green color light emitting application liquid, and a discharge port 58c for applying a blue color light emitting application liquid. The ink head 57 is first scanned one time, thus applying compositions to pixel rows. The ink head is then shifted to the right by three pixel rows, and scanning is again performed. In addition, the ink head is shifted to the right by a further three pixel rows, and scanning is again performed. Stripe shape compositions in which red, green, and blue colors are lined up next to each other can thus be applied by performing the scanning three times. All of the pixel rows in the pixel portion can be processed in one batch with this type of structure, similar to that of FIG. 11A, and it is possible to divide the pixel portion into a plurality of zones and perform processing several times.

The amount of time for controlling position when printing organic compound layers can be shortened, and the printing speed can be increased, in accordance with the present invention, by continuously discharging a composition and continuously forming the organic compound layers.

Embodiments

Embodiment 1

As shown in FIG. 12A, transparent pixel electrodes 1201 to 1204 are formed on a substrate 1200 at a pitch of 40 to 120 μm and having a thickness of 0.1 μm. Indium oxide, zinc oxide, tin oxide, or a mixed compound of these oxides is used as a material for forming the transparent pixel electrodes.

Next, as sown in FIG. 12B, partitions 1205 made from a resin material are formed between the pattern of the transparent pixel electrodes. The partitions have a thickness of 1 to 2 μm, a width of 20 μm, and are formed so as to cover edge portions of the transparent pixel electrodes. The partitions are formed so that compositions discharged from an ink head and impacting on the transparent pixel electrodes do not flow out and mix into the adjacent pixels.

Next, a first organic compound layer is formed having a thickness of 30 nm on the glass substrate 1200 having the transparent pixel electrodes (anodes) 1201 to 1204 by a spinning application method using an aqueous solution of poly(ethylene-dioxythiophene) and poly(styrene-sulfonic acid) (hereafter referred to as PEDOT/PSS). The PEDOT/PSS is used as a hole injecting layer 1206 (FIG. 12C).

Moisture is then evaporated by heat treatment processing, and a composition is applied by an ink jet printing apparatus 1207, forming a second organic compound layer with a film thickness of 0.05 μm to 0.2 μm. A metal chelate complex having π-conjugate ligands, dissolved in an acetonitrile solution is used as the composition. For example, to a pixel with a pitch of 90 μm, the composition is discharged with a viscosity of 1 to 20 cp and a diameter of approximately 80 μm. After discharging this composition using the ink jet, heating is performed at 80 to 120° C., vaporizing the solvent and forming a light emitting layer 1208 having a thickness of 50 to 150 nm. The light emitting layer 1208 is formed by overlapping with the discharged composition, forming linear shape or stripe shape layer, as explained by the embodiment mode (FIG. 12D).

A magnesium alloy (for example, AlMg) having a thickness of 0.1 μm to 0.2 μm is formed as a cathode 1209 by vacuum evaporation. A light emitting device is thus completed (FIG. 12E).

Embodiment 2

Figure 13A:
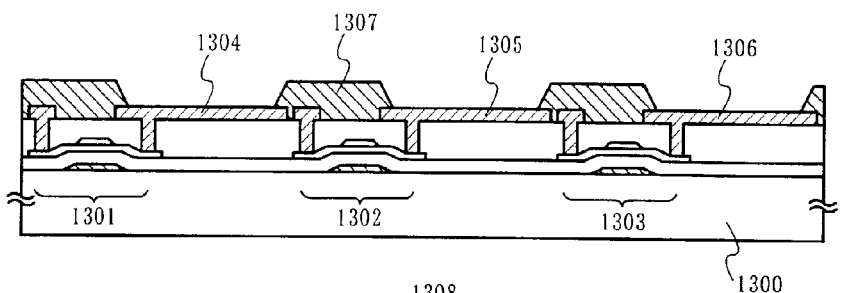
FIGS. 13A to 13D are cross sectional view for explaining a process of manufacturing an organic light emitting device using an ink jet method.

FIGS. 13A to 13D show an example of manufacturing an active matrix drive light emitting device by an ink jet method using the manufacturing method of the present invention. In FIG. 13A, thin film transistors 1301 to 1303 as active elements are formed on a substrate 1300. The thin film transistors are composed of a semiconductor film in which portions such as channel forming regions, source regions, and drain regions are formed, gate electrodes, gate insulating films, and the like. The structure of the thin film transistors has characteristics that differ depending upon type, such as top gate and bottom gate types, but there are no limitations placed on the type of structure when applying the present invention.

Pixel electrodes 1304 to 1306 connected to source or drain regions of the thin film transistors are formed at a pitch of 65 μm and having a thickness of 0.1 μm, for example. A minute pattern can be formed without the pattern being drawn out, if the composition of the present invention is used, when forming an organic compound layer by an ink jet method at a fine pitch. Partitions 1308 are formed from a resin material between the pixel electrode pattern. The partitions are formed having a thickness of 1 to 2 μm, a width of 20 μm, so as to cover edge portions of the pixel electrodes. The partitions are formed so that compositions discharged from an ink head and impacting on the transparent pixel electrodes do not flow out and mix into the adjacent pixels (FIG. 13A).

Figure 13B:
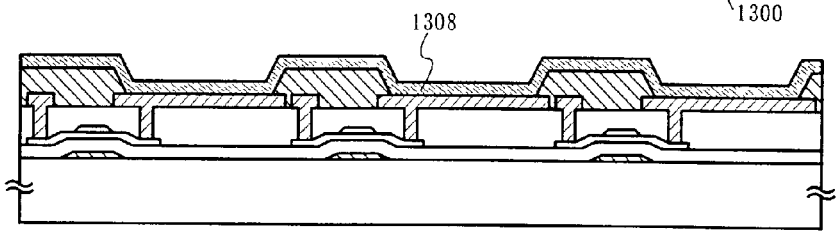

Next, a first organic compound layer is formed having a thickness of 30 nm on the glass substrate 1300 having the thin film transistors 1301 to 1303 by spin coating using an aqueous solution of poly(ethylene-dioxythiophene) and poly (styrene-sulfonic acid) (hereafter referred to as PEDOT/PSS). The PEDOT/PSS is used as a hole injecting layer 1308 (FIG. 13B).

Figure 13C:
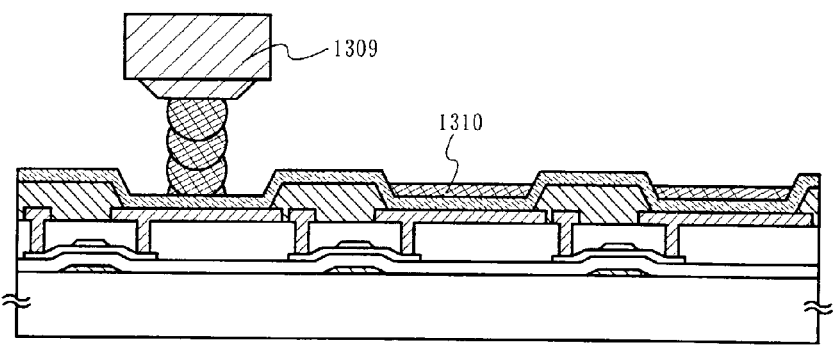

Moisture is then evaporated by heat treatment processing, and a composition is applied by an ink jet printing apparatus 1309, forming a light emitting layer as a second organic compound layer with a film thickness of 0.05 µm to 0.2 µm. A metal chelate complex having ō-conjugate ligands, dissolved in an acetonitrile solution is used as the composition. After discharging this composition using the ink jet, heating is performed at 80 to 120° C., vaporizing the solvent and forming a light emitting layer 1310 (FIG. 13C).

Figure 13D:
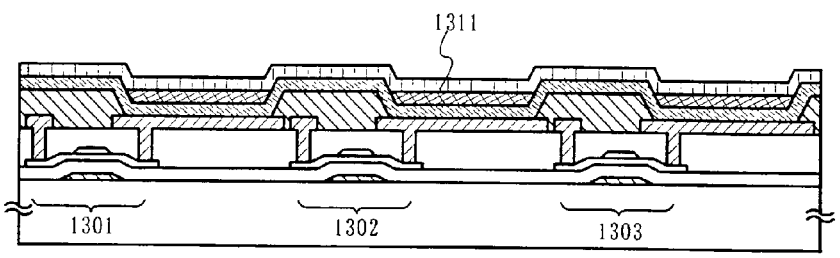

A magnesium alloy (for example, AlMg) having a thickness of 0.1 µm to 0.2 µm is formed as a cathode 1311 by vacuum evaporation. An active matrix drive light emitting device is thus completed (FIG. 13D).

Note that, although examples are shown having a two layer structure of a hole injecting layer and a light emitting layer for the light emitting devices shown in FIGS. 12A to 12E and FIGS. 13A to 13D, there are no limitations placed on the structure. Structures in which light emitting layers and associated injecting layers are arbitrarily formed by an ink jet method using the composition of the present invention may also be used.

Embodiment 3

Figure 14:
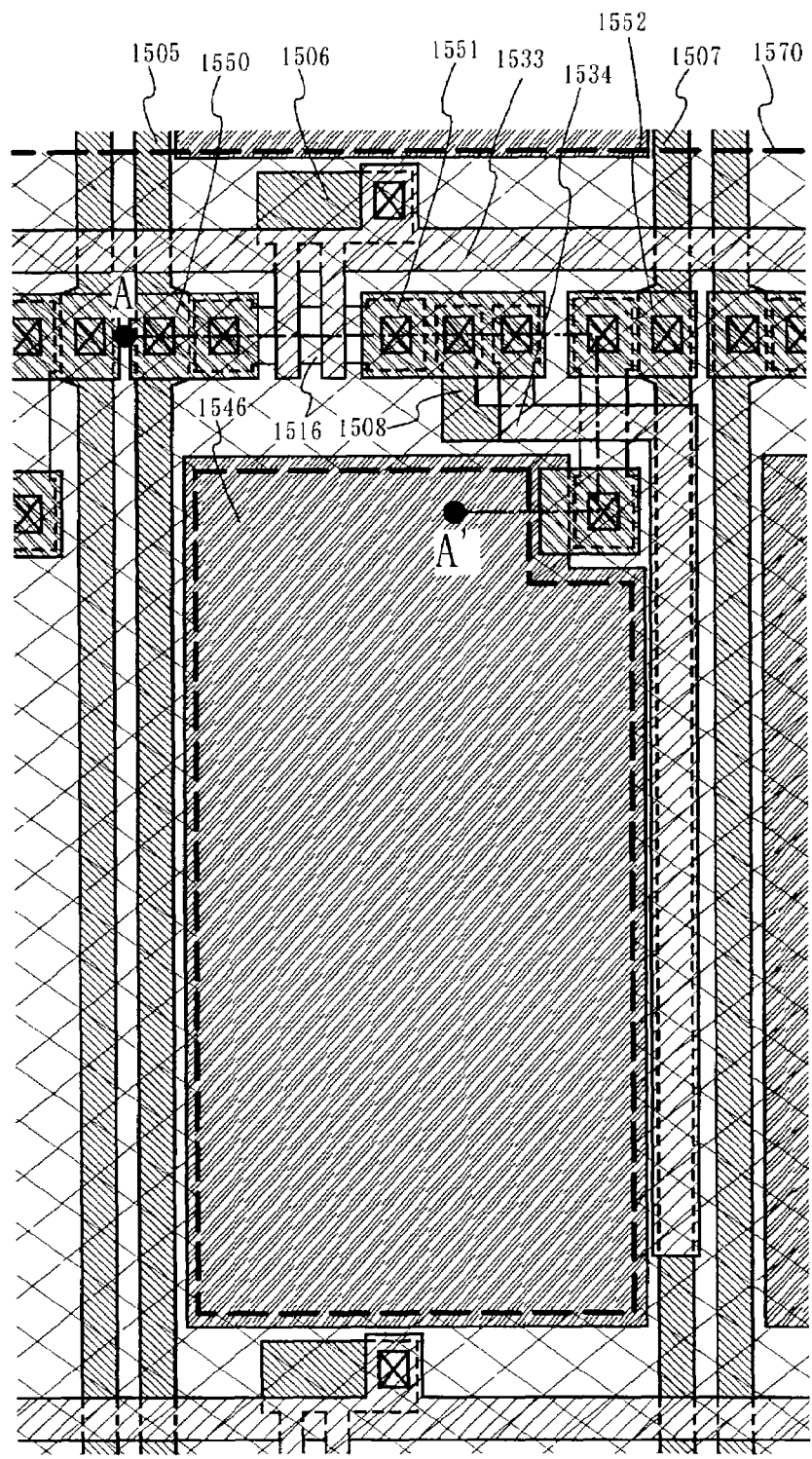
FIG. 14 is a top view for explaining the structure of a pixel having an organic light emitting element formed therein.
Figure 15:
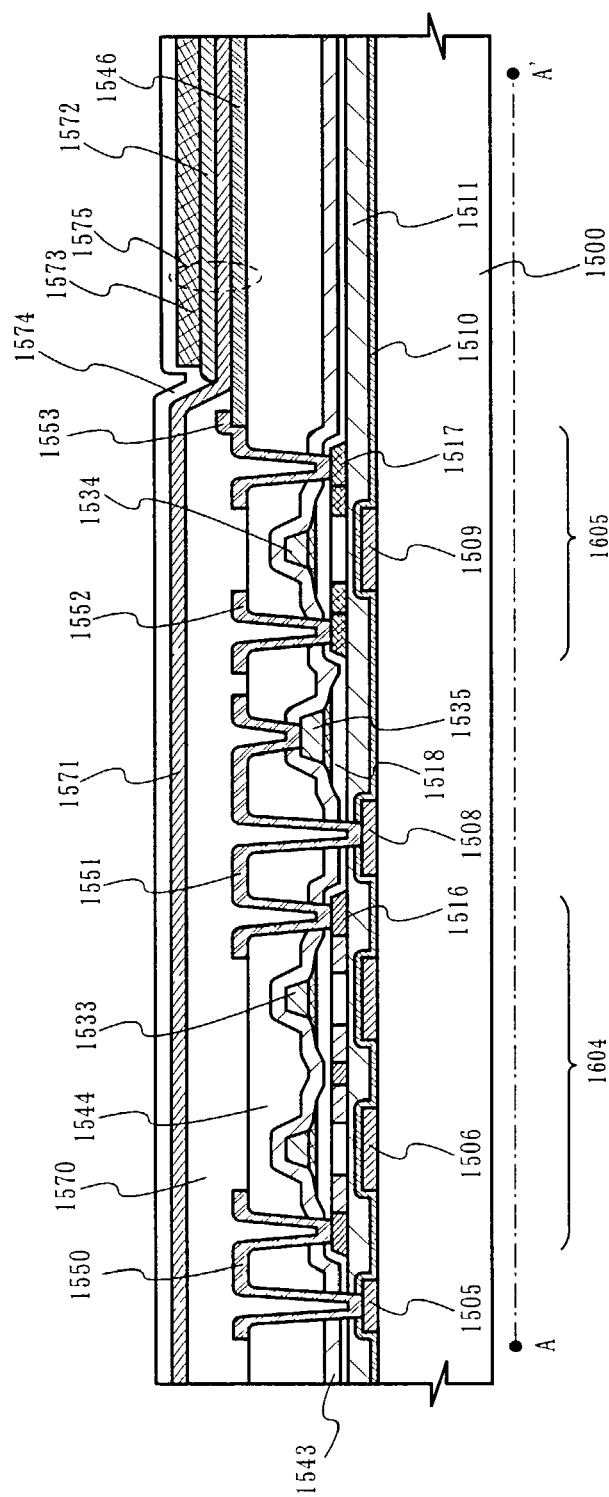
FIG. 15 is a cross sectional view for explaining the structure of a pixel formed in an organic light emitting element.

A specific example of a light emitting device manufactured by an ink jet method using a composition of the present invention is explained with reference to the figures. FIG. 14 shows a top view of an example of a pixel structure for an active matrix light emitting device. Further, FIG. 15 is a cross sectional view corresponding to FIG. 14 cut along a line segment A-A'. The pixel structure is explained with both figures using common reference numerals.

The pixel structure has two thin film transistors formed in one pixel. One thin film transistor is an n-channel thin film transistor 1604 used for switching operation, and the other is a p-channel thin film transistor 1605 used for controlling electric current flowing in an organic light emitting element. Of course, there is no need to limit the number of thin film transistors formed per one pixel when manufacturing an active matrix drive light emitting device using an ink jet printing apparatus of the present invention. An appropriate circuit structure conforming to the method of driving the light emitting device may be used.

As shown by FIG. 15, an organic light emitting element 1575 is composed of a first electrode 1546, a hole injecting layer 1571, a light emitting layer 1572, and a second electrode 1573. The first electrode and the second electrode can be distinguished between an anode and a cathode by their polarities. A high work function material such as indium oxide, tin oxide, or zinc oxide is used as material for forming the anode, while a low work function material formed of an alkaline metal or alkaline earth metal such as MgAg, AlMg, Ca, Mg, Li, AlLi, AlLiAg, and the like, typically a magnesium compound, is used to form the cathode.

In the p-channel thin film transistor 1605 and the n-channel thin film transistor 1605, active layers 1516 and 1517 are formed by polycrystalline semiconductor films, in which channel forming regions, source regions, drain regions, LDD regions, and the like are formed. First gate electrodes 1533 and 1534 are formed through a gate insulating film 1518, and second gate electrodes 1506 and 1509 are formed through insulating films 1510 and 1511, so as to oppose the first electrodes which sandwiching an active layer therebetween. Interlayer insulating film 1543 and 1544 are formed by a combination of inorganic insulating films and organic insulating films. A wiring 1505 is a signal line based on image data, and a wiring 1507 is an electric power source supply line for supplying electric current to the organic light emitting element.

The first electrode 1546 of the organic light emitting element 1575 is connected to an electrode 1553 of the p-channel thin film transistor 1605. A partition 1570 separates adjacent pixels, and is formed for the purpose of partitioning each pixel so that compositions do not reach adjacent pixels when light emitting layers are formed by an ink jet method. The partition is formed by a photosensitive material or thermally setting resin material, such as polyimide, acrylic, polyimide amide, or polybenzimidazole, and so as to cover edge portions of the first electrodes. The organic compound layer may be formed continuously in a vertical direction, or may be formed continuously in a horizontal direction.

The surface of the partition 1570 formed by a resin material may be modified in property by plasma processing using an inert gas such as argon to harden the surface. The hole injecting layer 1571 is formed having a thickness of 30 nm by first applying an aqueous solution of poly(ethylenedioxythiophene) and poly(styrene-sulfonic acid) (hereafter referred to as PEDOT/PSS) to the entire substrate surface by a spin application method, and then performing drying.

The light emitting layer is formed by applying, using an ink jet printing apparatus a composition in which the π-conjugate polymer material poly(N-vinyl carbazole: PVK), used as a host material, and a metal chelate complex having π-conjugate ligands, used as a guest material, are dispersed in a solvent. The composition discharged from the ink head impacts in regions surrounded by the partition. Heat treatment is performed next within a nitrogen atmosphere at a temperature of 80 to 120° C., forming the light emitting layer 1572 at a thickness of 0.1 µm to 0.2 µm.

A passivation film 1574 is formed on the light emitting layer 1572. Materials that are good barriers with respect to oxygen and water vapor, such as silicon nitride, silicon oxide, and diamond like carbon (DLC) may be used in forming the passivation film.

An active matrix drive light emitting device can thus be manufactured. A light emitting layer pattern can be formed with high precision, and the rate of occurrence of defective pixels that do not emit light can be lowered, by manufacturing the light emitting device using the composition of the present invention.

Embodiment 4

Figure 16:
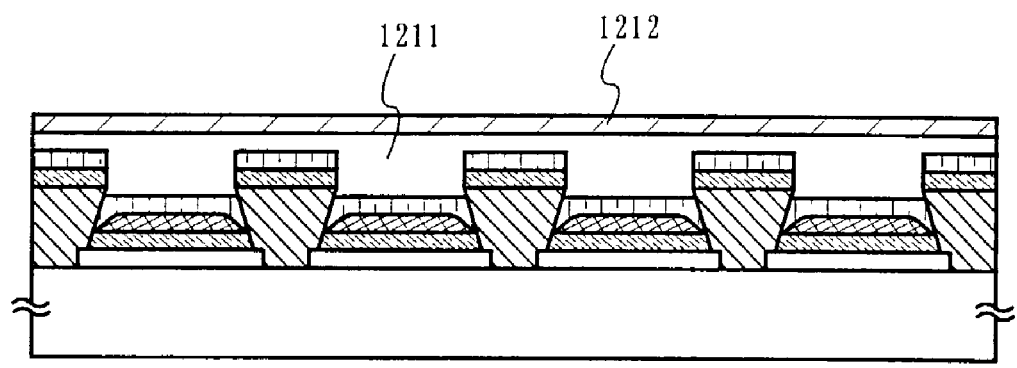
FIG. 16 is a cross sectional view showing an example of a sealing structure of a light emitting device.

As shown by FIG. 16, a light emitting device having good sealing qualities can be obtained by forming a resin layer 1211 made from a resin material such as acrylic, polyimide, polyimide amide, or polybenzimidazole, on a light emitting device manufactured in accordance with FIGS. 12A to 12E, and in addition, fixing a sealing sheet 1212 made from a material such as plastic or glass on the resin layer. The gas barrier characteristics can be increased, and therefore the reliability of the light emitting device can be raised, by forming a coating of silicon nitride or DLC on the surface of the sealing sheet 1212.

Embodiment 5

Figure 17A:
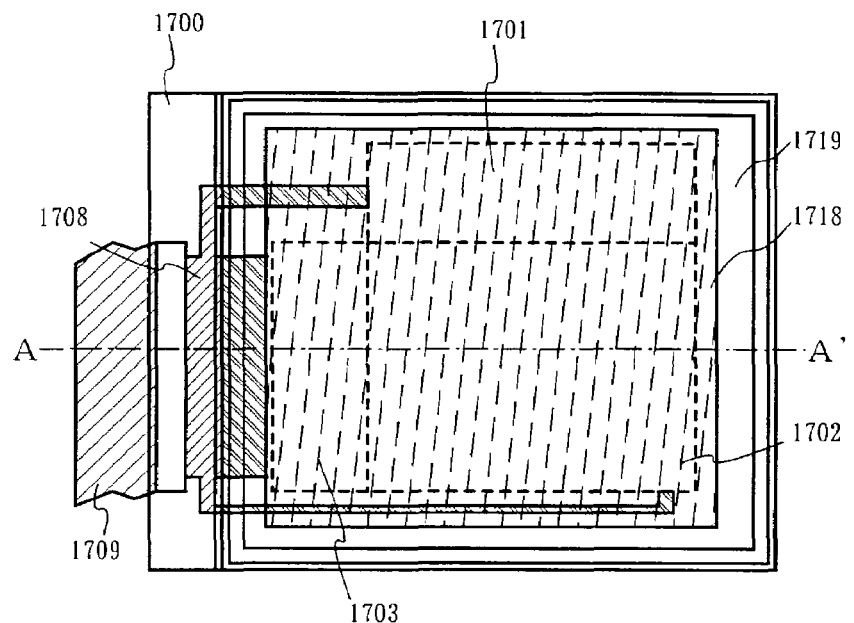
FIGS. 17A and 17B are a top view and a cross sectional view, respectively, showing the structure of an active matrix drive light emitting device.
Figure 17B:
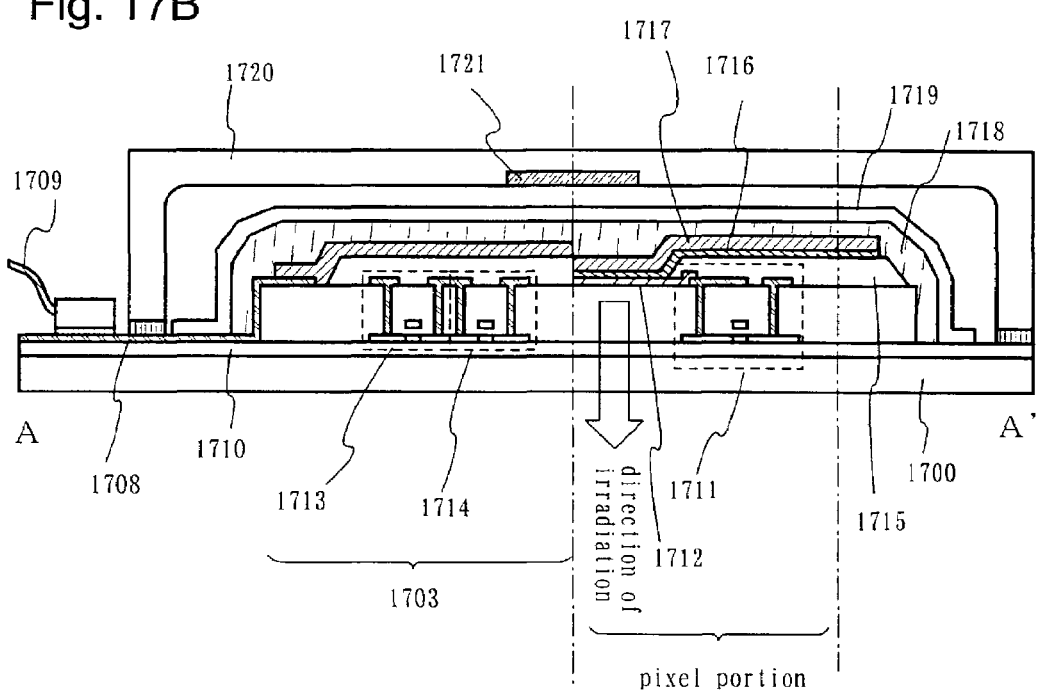

An embodiment of a light emitting display device having organic light emitting elements is shown in FIGS. 17A and 17B in Embodiment 5. FIG. 17A is a top view showing a light emitting device, and a cross sectional view of the light emitting device cut along a line segment A-A' is shown in FIG. 17B. A pixel region 1702, a source side driver circuit 1701, and a gate side driver circuit 1703 are formed on a substrate 1700 having an insulating surface (for example, a glass substrate, a crystallized glass substrate, or a plastic substrate). Organic compound layers in the pixel region are formed by the ink jet method of the present invention. Further, known thin film transistors and known circuit techniques may be applied to the driver circuits.

Reference numeral 1718 denotes a sealing material, reference numeral 1719 denotes a DLC film. The pixel region and the driver circuit portion are covered by the sealing material 1718, and the sealing material is covered by the DLC film 1719. In addition, this is sealed by a covering material 1720 using an adhesive. It is preferable that the same material as that of the substrate 1700 be used for the covering material 1720 in order to allow the light emitting device to withstand deformation due to heat and external forces. For example, it is preferable to use a glass substrate, which is processed into a concave shape (depth of 3 to 10 µm) shown in FIG. 17B by a method such as sandblasting. It is further preferable to form a concave portion (depth 50 to 200 µm) by additional processing, in which a drying agent 1721 may be received. Note that reference numeral 1708 denotes a wiring for transmitting signals input to the source side driver circuit 1701 and the gate side driver circuit 1703, and that video signals and clock signals are received from an FPC (flexible printed circuit) 1709 that becomes an external input terminal.

The cross sectional structure is explained next using FIG. 17B. An insulating film 1710 is formed on the substrate 1700, and the pixel region 1702 and the gate side driver circuit 1703 are formed on the insulating film 1710. The pixel region 1702 is formed by a plurality of pixels each containing an electric current control thin film transistor 1711, and one electrode 1712 of a light emitting element electrically connected to the drain of the thin film transistor 1711. Further, the gate side driver circuit 1703 is formed using a CMOS circuit in which an n-channel thin film transistor 1713 and a p-channel thin film transistor 1714 are combined. The thin film transistors (including transistors 1711, 1713, and 1714) may be manufactured in accordance with a known technique.

The pixel electrode 1712 functions as an anode of an organic light emitting element. Further, partitions 1715 are formed at both edges of the pixel electrode 1712, and an organic compound layer 1716 and a cathode 1717 of the organic light emitting element are formed on the light emitting element electrode 1712. The organic compound layer 1716 is formed by suitably combining layers such as hole injecting layers, light emitting layers, and electron injecting layers. All of these may be formed by an ink jet printing technique, and may also be formed by combining a spinning application method with an ink jet method.

For example, a first organic compound layer can be formed from PEDOT as a hole injecting layer, and a linear shape or stripe shape second organic compound layer can be formed on the first organic compound layer by using an ink jet printing apparatus. In this case the second organic compound layer becomes the light emitting element. It is possible to apply high molecular weight materials or intermediate molecular weight materials as the organic compound materials.

The cathode 1717 also functions as a common wiring for all pixels, and is electrically connected to the FPC 1709 through a connection wiring 1708. In addition, all elements contained in the pixel region 1702 and in the gate side driver circuit 1703 are covered by the cathode 1717, the sealing material 1718, and the protective film 1719. Further, it is preferable that after completely covering the organic light emitting elements by using the sealing material 1718, at least the protective film 1719 made from a DLC film or the like is formed on the surface (exposed surface) of the sealing material 1718 as shown in FIGS. 17A and 17B. The protective film may also be formed on all surfaces, including the rear surface of the substrate. It is necessary to exercise care at this point so that the protective film is not formed in the portion where the external input terminal (FPC) is formed. A mask may be used so that the protective film is not formed there, or the external input terminal portion may be covered by masking tape so that the protective film is not formed there.

With this type of structure, the organic light emitting elements can be completely shut off from the outside by sealing the organic light emitting elements using the sealing material 1718 and the protective film, so that substances from the outside that promote degradation by oxidation of the organic compound layers, such as moisture and oxygen, can be prevented from penetrating. A light emitting device having high reliability can thus be obtained. Furthermore, a structure in which light is emitted in a direction opposite that of FIGS. 17A and 17B, whereby the pixel electrode is taken as the cathode and the organic compound layers and the anode are laminated on the pixel electrode, may also be used.

Embodiment 6

Figure 18:
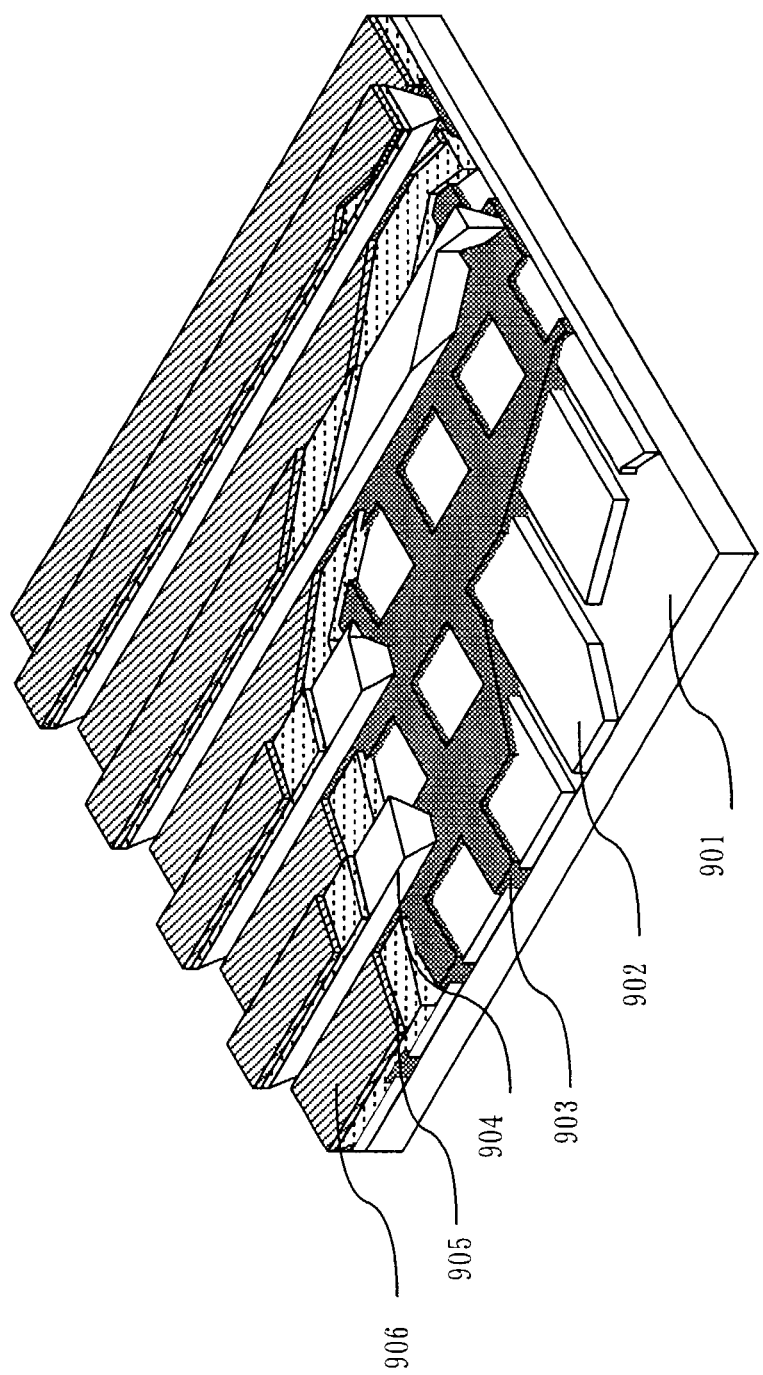
FIG. 18 is a perspective view for explaining the structure of a pixel portion of a passive matrix type light emitting device.

FIG. 18 shows an example of the external appearance of a light emitting device. Transparent pixel electrodes (anodes) 902 and a cathode 906 are formed so as to intersect, and organic compound layers are formed in between. An insulating film 903 is formed between the transparent pixel electrodes (anodes) 902, and partitions 904 are formed on the insulating film. Note that the insulating film 903 may also be omitted. It is possible to form the organic compound layers by appropriately combining an ink jet method with a spinning application method. Films being formed will also be formed on the partitions 904 if a spinning application method is used.

Organic compounds which do not have sublimability, and have molecularity equal to or less than 10 or have a molecular chain length equal to or less than 10 µm, (intermediate molecular weight organic compounds) are used when forming layers such as light emitting layers by those materials. The materials may be dissolved in, or dispersed in, an aqueous, alcohol, or glycol solvent for cases in which pattern formation is performed using an ink jet method. Whichever is used, the viscosity can be regulated to a viscosity capable of being applied to pattern formation using an ink jet method, and film formation can be performed simply and in a short amount of time under optimal conditions.

A composition discharged from an ink head impacts between the partitions 904, and an organic layer 905 containing a light emitting layer and the like can be formed by drying. The partitions 904 are formed having a stripe shape as shown by FIGS. 12A to 12E, and the organic compound layer 905 is formed continuously between the stripes. Pattern formation of the light emitting layer can be performed with good efficiency by forming the organic compound layer in this way, and the rate of occurrence of defective pixels that do not emit light can be reduced.

Embodiment 7

Various electronic devices can be completed by using the light emitting device formed by the present invention. As one of an example of such electronic apparatus, there are pointed out a video camera, a digital camera, a head mount display (goggle type display), a car navigation system, a projector, a car stereo, a personal computer, a portable information terminal (mobile computer, portable telephone or electronic book) and the like. Examples of these are shown in FIGS. 19A-19C and 20A to 20C.

Figure 19A:
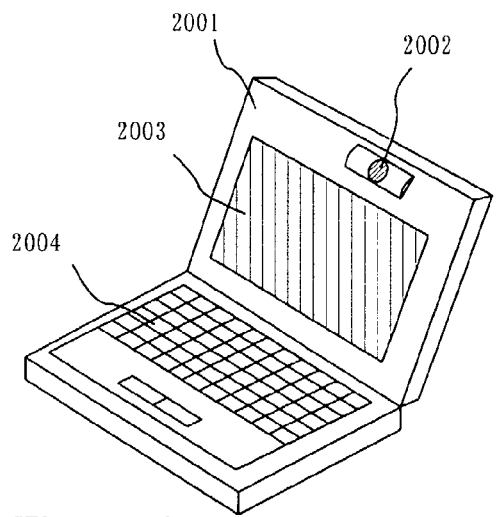
FIGS. 19A to 19F are views showing examples of electronic equipment.

FIG. 19A shows a personal computer including a main body 2001, an image input portion 2002, a display portion 2003, a keyboard 2004, and the like. The light emitting device formed by the present invention can be incorporated into the display portion 2003, and thus the personal computer can be completed.

Figure 19B:
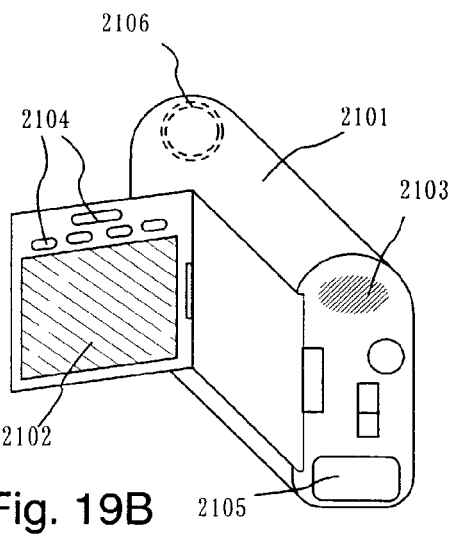

FIG. 19B shows a video camera including a main body 2101, a display portion 2102, a voice input portion 2103, operation switches 2104, a battery 2105, an image receiving portion 2106, and the like. The light emitting device formed by the present invention can be incorporated into the display portion 2102, and thus the video camera can be completed.

Figure 19C:
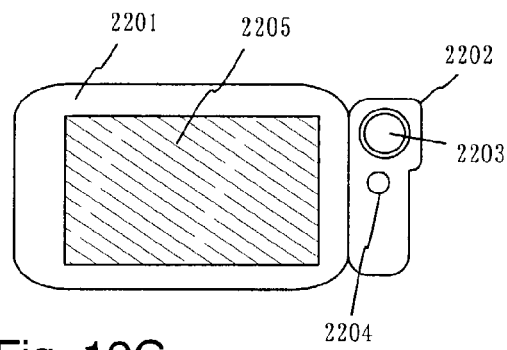

FIG. 19C shows a mobile computer including a main body 2201, a camera portion 2202, an image receiving portion 2203, an operation switch 2204, a display portion 2205, and the like. The light emitting device formed by the present invention can be incorporated into the display portion 2205, and thus the mobile computer can be completed.

Figure 19D:
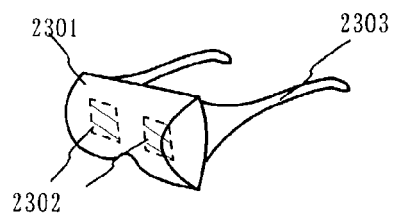

FIG. 19D shows a goggle type display including a main body 2301, a display portion 2302 and an arm portion 2303. The light emitting device formed by the present invention can be incorporated into the display portion 2302, and thus the goggle type display can be completed.

Figure 19E:
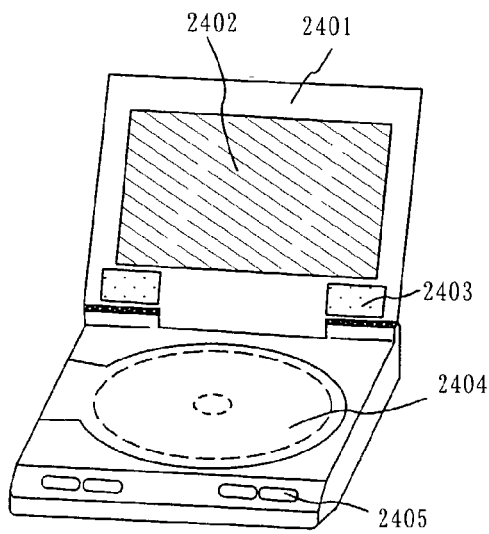

FIG. 19E shows a player using a record medium recorded with programs (hereinafter, referred to as record medium) including a main body 2401, a display portion 2402, a speaker portion 2403, a record medium 2404 and an operation switch 2405. The player uses DVD (Digital Versatile Disc) or CD as the record medium and can enjoy music, enjoy movie and carry out game or Internet. The light emitting device formed by the present invention can be incorporated into the display portion 2402, and thus the player can be completed.

Figure 19F:
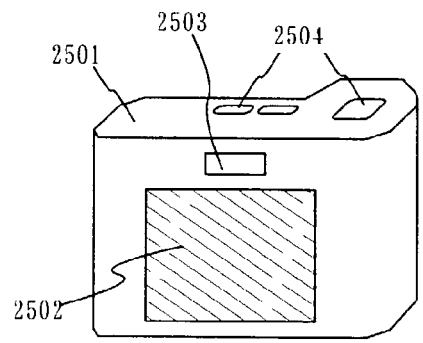

FIG. 19F shows a digital camera including a main body 2501, a display portion 2502, an eye contact portion 2503, operation switches 2504 and an image receiving portion (not illustrated). The light emitting device formed by the present invention can be incorporated into the display portion 2502, and thus the digital camera can be completed.

Figure 20A:
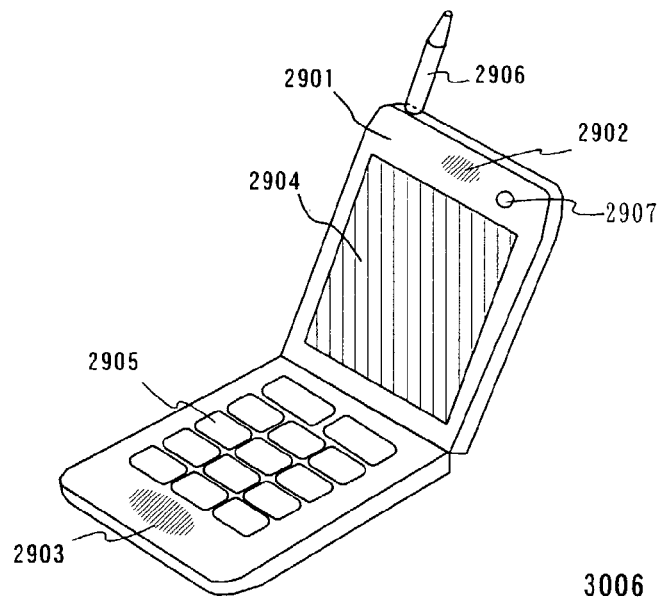
FIGS. 20A to 20C are views showing examples of electronic equipment.

FIG. 20A shows a portable telephone including a main body 2901, a sound output portion 2902, a sound input portion 2903, a display portion 2904, an operation switch 2905, an antenna 2906 and an image input portion (CCD, image sensor or the like) 2907. The light emitting device formed by the present invention can be incorporated into the display portion 2904, and thus the portable telephone can be completed.

Figure 20B:
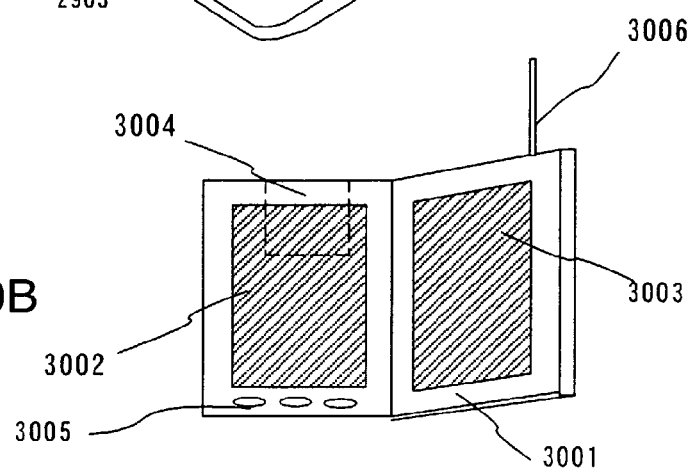

FIG. 20B shows a portable book (electronic book) including a main body 3001, display portions 3002 and 3003, a record medium 3004, an operation switch 3005 and an antenna 3006. The light emitting device formed by the present invention can be incorporated into the display portions 3002 and 3003, and thus the portable book can be completed.

Figure 20C:
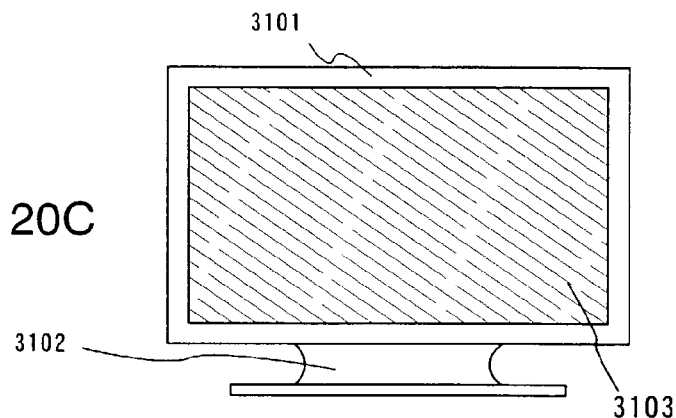

FIG. 20C shows a display including a main body 3101, a support base 3102, a display portion 3103 and the like. The light emitting device formed by the present invention can be incorporated into the display portion 3103, and thus the display can be completed. In addition, the display shown in FIG. 20C is small and medium type or large type, for example, screen of the display sized 5 to 20 inches. Moreover, it is preferable to mass-produce by executing a multiple pattern using a substrate sized 1×1 m to form such sized display section.

As described above, according to the present invention, the amount of time required for position alignment can be shortened, formation of an organic compound layer becomes easier, and the amount of processing time can be reduced, by forming a linear shape or a stripe shape organic compound layer while continuously discharging a composition on a substrate one dot at a time.

In particular, the present invention is suitable for cases in which it is applied to a production method whereby a plurality of display panels are cut out from one large surface area substrate. Furthermore, there is an advantageous effect for cases in which a plurality of pixel regions are formed in a large size substrate. The advantage is that an ink head can be moved at high speed with respect to the large size substrate, and productivity can be thus increased, by instantaneously stopping discharging of a mixture during periods of movement between pixel regions.

What is claimed is:

1. A method of manufacturing a light emitting device, comprising:
   forming an organic compound layer over a pixel electrode in a matrix form by discharging a composition comprising an organic compound having light emitting characteristics from an ink head;
   flattening the organic compound layer discharged over the pixel electrode by expelling a gas from a nozzle, wherein said flattening occurs while discharging the organic compound layer over the pixel electrode.

2. A method of manufacturing a light emitting device, comprising:
   arranging thin film transistors and pixel electrodes in a matrix form;
   forming an organic compound layer over the pixel electrode by discharging a composition comprising an organic compound having light emitting characteristics from an ink head;
   flattening the organic compound layer discharged over the pixel electrode by expelling a gas from a nozzle, wherein said flattening occurs while discharging the organic compound layer over the pixel electrode.

3. A method of manufacturing a light emitting device, comprising:
   forming a pixel electrode on a substrate having a thin film transistor;
   forming an organic compound layer over the pixel electrode by discharging a composition comprising an organic compound having light emitting characteristics from an ink head;
   flattening the organic compound layer discharged over the pixel electrode by expelling a gas from a nozzle, wherein said flattening occurs while discharging the organic compound layer over the pixel electrode.

4. A method of manufacturing a light emitting device, comprising:

forming a pixel electrode over a substrate having a thin film transistor;

forming a hole injecting layer on the pixel electrode; and forming an organic compound layer over the hole injecting layer by discharging a composition comprising an organic compound having light emitting characteristics from an ink head;

flattening the organic compound layer discharged over the pixel electrode by expelling a gas from a nozzle, wherein said flattening occurs while discharging the organic compound layer over the pixel electrode.

5. A method of manufacturing a light emitting device, comprising:

forming a pixel electrode on a substrate having a thin film transistor;

forming a hole injecting layer on the pixel electrode with the spinning application method; and forming an organic compound layer over the hole injecting layer by discharging a composition comprising an organic compound having light emitting characteristics from an ink head with the ink jet method;

flattening the organic compound layer discharged over the pixel electrode by expelling a gas from a nozzle, wherein said flattening occurs while discharging the organic compound layer over the pixel electrode.

6. A method of manufacturing a light emitting device according to claim 1, wherein a solution in which an organic light emitting material or a precursor thereof is dissolved or dispersed in a solvent is used as the composition.

7. A method of manufacturing a light emitting device according to claim 2, wherein a solution in which an organic light emitting material or a precursor thereof is dissolved or dispersed in a solvent is used as the composition.

8. A method of manufacturing a light emitting device according to claim 3, wherein a solution in which an organic light emitting material or a precursor thereof is dissolved or dispersed in a solvent is used as the composition.

9. A method of manufacturing a light emitting device according to claim 4, wherein a solution in which an organic light emitting material or a precursor thereof is dissolved or dispersed in a solvent is used as the composition.

10. A method of manufacturing a light emitting device according to claim 5, wherein a solution in which an organic light emitting material or a precursor thereof is dissolved or dispersed in a solvent is used as the composition.

11. A method of manufacturing a light emitting device according to claim 1, wherein the step of flattening the organic compound layer comprises expelling the gas from the nozzle which is provided in the vicinity of a discharge port of the ink head to smooth the organic compound layer discharged over the pixel electrode.

12. A method of manufacturing a light emitting device according to claim 2, wherein the step of flattening the organic compound layer comprises expelling the gas from the nozzle which is provided in the vicinity of a discharge port of the ink head to smooth the organic compound layer discharged over the pixel electrode.

13. A method of manufacturing a light emitting device according to claim 3, wherein the step of flattening the organic compound layer comprises expelling the gas from the nozzle which is provided in the vicinity of a discharge port of the ink head to smooth the organic compound layer discharged over the pixel electrode.

14. A method of manufacturing a light emitting device according to claim 4, wherein the step of flattening the organic compound layer comprises expelling the gas from the nozzle which is provided in the vicinity of a discharge port of the ink head to smooth the organic compound layer discharged over the pixel electrode.

15. A method of manufacturing a light emitting device according to claim 5, wherein the step of flattening the organic compound layer comprises expelling the gas from the nozzle which is provided in the vicinity of a discharge port of the ink head to smooth the organic compound layer discharged over the pixel electrode.

16. A method of manufacturing a light emitting device comprising:

forming an organic compound layer over a pixel electrode in a matrix form by discharging a composition comprising an organic compound having light emitting characteristics from an ink head;

flattening the organic compound layer discharged over the pixel electrode by expelling a gas from a nozzle, wherein said flattening occurs while discharging the organic compound layer over the pixel electrode.

17. A method of manufacturing a light emitting device, comprising:

forming a pixel electrode on a substrate having a thin film transistor;

forming an organic compound layer over the pixel electrode by discharging a composition comprising an organic compound having light emitting characteristics from an ink head;

flattening the organic compound layer discharged over the pixel electrode by expelling a gas from a nozzle, wherein said flattening occurs while discharging the organic compound layer over the pixel electrode.

18. A method of manufacturing a light emitting device according to claim 16, wherein a solution in which an organic light emitting material or a precursor thereof is dissolved or dispersed in a solvent is used as the composition.

19. A method of manufacturing a light emitting device according to claim 17, wherein a solution in which an organic light emitting material or a precursor thereof is dissolved or dispersed in a solvent is used as the composition.

20. A method of manufacturing a light emitting device according to claim 1, wherein the gas is nitrogen or argon.

21. A method of manufacturing a light emitting device according to claim 2, wherein the gas is nitrogen or argon.

22. A method of manufacturing a light emitting device according to claim 3, wherein the gas is nitrogen or argon.

23. A method of manufacturing a light emitting device according to claim 4, wherein the gas is nitrogen or argon.

24. A method of manufacturing a light emitting device according to claim 5, wherein the gas is nitrogen or argon.

25. A method of manufacturing a light emitting device according to claim 16, wherein the gas is nitrogen or argon.

26. A method of manufacturing a light emitting device according to claim 17, wherein the gas is nitrogen or argon.

* * * * *